United States Patent
Hwang et al.

(10) Patent No.: US 11,139,314 B2
(45) Date of Patent: Oct. 5, 2021

(54) SEMICONDUCTOR DEVICE

(71) Applicant: SAMSUNG ELECTRONICS CO., LTD., Suwon-si (KR)

(72) Inventors: Sung Min Hwang, Hwaseong-si (KR); Joon Sung Lim, Seongnam-si (KR); Woo Sung Yang, Gwangmyeong-si (KR); Dong Sik Lee, Hwaseong-si (KR)

(73) Assignee: SAMSUNG ELECTRONIC CO., LTD., Suwon-si (KR)

( * ) Notice: Subject to any disclaimer, the term of this patent is extended or adjusted under 35 U.S.C. 154(b) by 147 days.

(21) Appl. No.: 16/686,967

(22) Filed: Nov. 18, 2019

(65) Prior Publication Data
US 2020/0227435 A1    Jul. 16, 2020

(30) Foreign Application Priority Data

Jan. 11, 2019 (KR) .......................... 10-2019-0003717

(51) Int. Cl.
   *H01L 27/11582*  (2017.01)
   *H01L 27/1157*   (2017.01)
   *H01L 27/11573*  (2017.01)

(52) U.S. Cl.
   CPC .... *H01L 27/11582* (2013.01); *H01L 27/1157* (2013.01); *H01L 27/11573* (2013.01)

(58) Field of Classification Search
   CPC ................................... H01L 27/11563–11582
   See application file for complete search history.

(56) References Cited

U.S. PATENT DOCUMENTS

| | | | |
|---|---|---|---|
| 5,729,491 A | * | 3/1998 | Kim ................... G11C 16/0483 257/E27.103 |
| 7,936,004 B2 | | 5/2011 | Kito et al. |
| 9,012,074 B2 | | 4/2015 | Chae et al. |
| 9,171,587 B2 | | 10/2015 | Tanzawa |
| 9,431,420 B2 | | 8/2016 | Hwang |
| 9,613,981 B2 | | 4/2017 | Huo et al. |
| 9,853,045 B2 | | 12/2017 | Hwang et al. |
| 10,002,877 B2 | | 6/2018 | Park et al. |
| 2008/0173928 A1 | | 7/2008 | Arai et al. |
| 2011/0002178 A1 | | 1/2011 | Hwang et al. |

(Continued)

*Primary Examiner* — Robert G Bachner
*Assistant Examiner* — Molly K Reida
(74) *Attorney, Agent, or Firm* — F. Chau & Associates, LLC

(57) ABSTRACT

A semiconductor device includes gate electrodes spaced apart from each other in a first direction perpendicular to a substrate's upper surface, and extending by different lengths in a second direction perpendicular to the first direction. The device further includes first and second channels penetrating the gate electrodes and extending in the first direction, a horizontal portion disposed in lower portions of the gate electrodes and connecting lower portions of the first and second channels to each other, and a source line disposed in an upper portion of the second channel and connected to the second channel. The gate electrodes include memory cell electrodes included in memory cells, a first ground select electrode disposed in lower portions of the memory cell electrodes, a second ground select electrode disposed in upper portions of the memory cell electrodes, and a string select electrode disposed in upper portions of the memory cell electrodes.

31 Claims, 29 Drawing Sheets

(56) References Cited

U.S. PATENT DOCUMENTS

| | | |
|---|---|---|
| 2015/0011064 A1 | 1/2015 | Hwang et al. |
| 2017/0243885 A1 | 8/2017 | Hwang et al. |
| 2017/0287930 A1 | 10/2017 | Lee et al. |
| 2017/0352679 A1 | 12/2017 | Chen |
| 2017/0352680 A1 | 12/2017 | Shin et al. |
| 2019/0074292 A1 | 3/2019 | Hwang et al. |
| 2020/0105721 A1* | 4/2020 | Park ................... H01L 25/50 |
| 2020/0203329 A1* | 6/2020 | Kanamori ......... H01L 27/11556 |

* cited by examiner

| String | Program | Erase | Read |
|---|---|---|---|
| BL | BL1;Vcc<br>BL2;0V | Floating | Vcc |
| SSL1 | SSL1;Vcc<br>SSL2;0V | Floating | Vread |
| GSL2 | Vcc | Floating | Vread |
| WLn | Vpass | 0V | Vread |
| ⋮ | ⋮ | ⋮ | ⋮ |
| WL1 | Vpgm | 0V | Vread |
| WL0 | Vpass | 0V | Vread |
| GSL1 | 0V | Floating | Vread |
| CSL | Vcc↑ | Vers | 0V |

FIG. 6B

SEMICONDUCTOR DEVICE

CROSS-REFERENCE TO RELATED APPLICATIONS

This application claims priority under 35 U.S.C. § 119 to Korean Patent Application No. 10-2019-0003717 filed on Jan. 11, 2019 in the Korean Intellectual Property Office, the disclosure of which is herein incorporated by reference in its entirety.

TECHNICAL FIELD

Example embodiments of the present inventive concept relate to a semiconductor device.

DISCUSSION OF THE RELATED ART

Semiconductor devices have consistently been reduced in size and designed to process high capacity data. In the case of a semiconductor device functioning as a memory device, since the size of a memory cell has been reduced to achieve high integration density, a wiring structure for applying an electrical signal to operate memory cells included in such a device has also become more complex. Accordingly, there has been demand for a semiconductor device having improved integration density and reliability, while still allowing manufacturing processes to be efficiently performed.

SUMMARY

Example embodiments of the present inventive concept provide a semiconductor device having increased integration density and improved reliability.

According to an example embodiment of the present inventive concept, a semiconductor device includes a plurality of gate electrodes, first and second channels, a horizontal portion, and a source line. The gate electrodes are spaced apart from each other and stacked in a first direction perpendicular to an upper surface of a substrate, and extend by different lengths in a second direction perpendicular to the first direction. The first and second channels penetrate through the gate electrodes and extend in the first direction. The horizontal portion is disposed in lower portions of the gate electrodes and connect lower portions of the first and second channels to each other. The source line is disposed in an upper portion of the second channel and is connected to the second channel. The gate electrodes include memory cell electrodes included in memory cells, a first ground select electrode disposed in lower portions of the memory cell electrodes, a second ground select electrode disposed in upper portions of the memory cell electrodes, and a string select electrode disposed in the upper portions of the memory cell electrodes.

According to an example embodiment of the present inventive concept, a semiconductor device includes a bit line, a source line, a first cell string, and a second cell string. Each of the first and second cell strings includes a plurality of memory cell transistors connected to each other in series, a first ground select transistor disposed on a first end of the memory cell transistors, a second ground select transistor disposed on a second end of the memory cell transistors, and a string select transistor. The first cell string is connected to the bit line, and the second cell string is separated from the bit line and is connected to the source line.

According to an example embodiment of the present inventive concept, a semiconductor device includes a plurality of gate electrodes including memory cell electrodes spaced apart from each other and stacked in a direction perpendicular to an upper surface of a substrate, a first ground select electrode disposed between the substrate and the memory cell electrodes, a string select electrode disposed on the memory cell electrodes, and a second ground select electrode disposed on the memory cell electrodes. The memory cell electrodes are included in memory cells. The semiconductor device further includes a plurality of channels penetrating through the gate electrodes and extending onto the substrate, and constituting the memory cells. The semiconductor device further includes a dummy channel penetrating through the gate electrodes and extending onto the substrate, and electrically connected to a source line.

BRIEF DESCRIPTION OF THE DRAWINGS

The above and other features of the present inventive concept will become more apparent by describing in detail example embodiments thereof with reference to the accompanying drawings, in which:

FIGS. 6A and 6B are diagrams illustrating operations of a semiconductor device according to an example embodiment of the present inventive concept.

DETAILED DESCRIPTION

Figure 1:
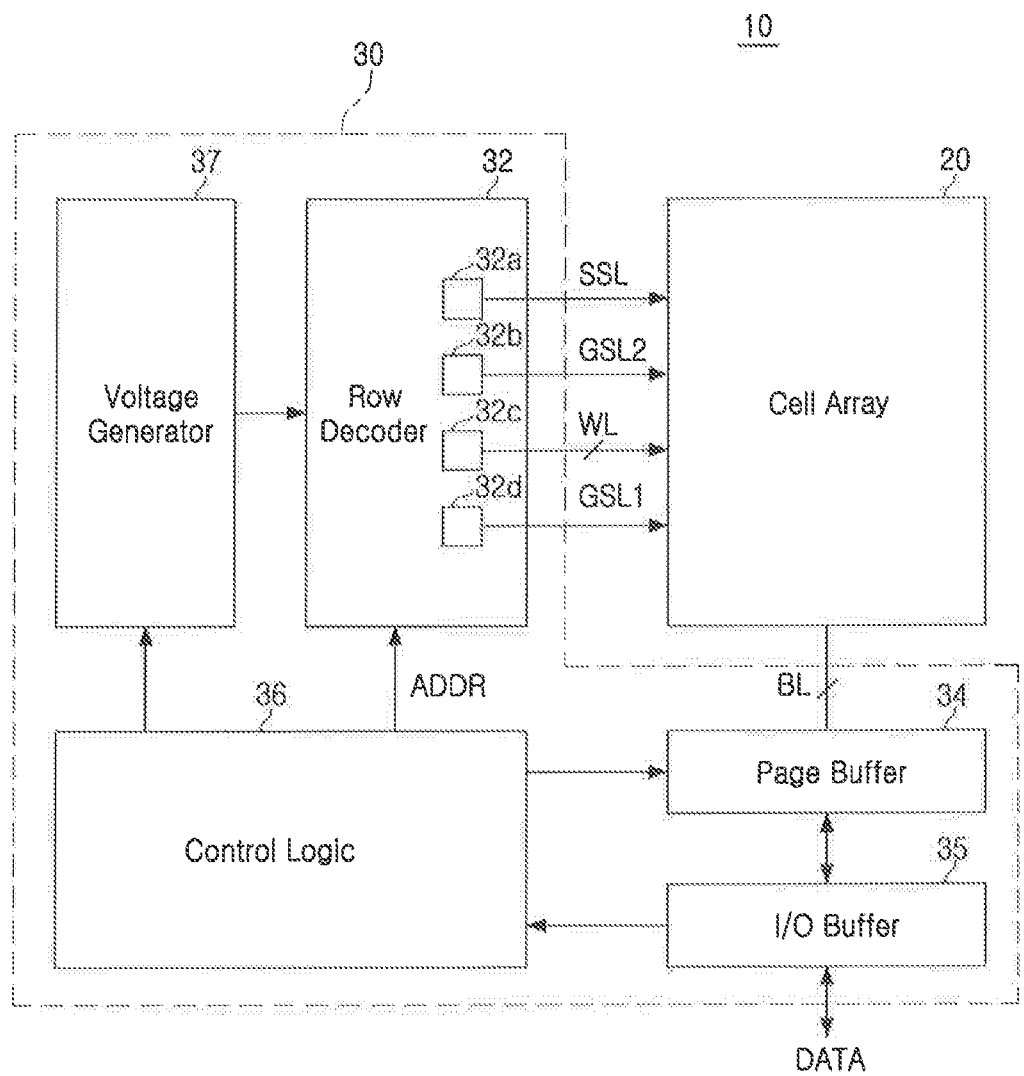
FIG. 1 is a schematic block diagram illustrating a semiconductor device according to an example embodiment of the present inventive concept.

Example embodiments of the present inventive concept will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

It should be understood that descriptions of features or aspects within each example embodiment should typically be considered as available for other similar features or aspects in other example embodiments, unless the context clearly indicates otherwise.

As used herein, the singular forms "a", "an" and "the" are intended to include the plural forms as well, unless the context clearly indicates otherwise.

FIG. 1 is a schematic block diagram illustrating a semiconductor device according to an example embodiment.

Referring to FIG. 1, a semiconductor device 10 may be a vertical type NAND flash memory device, and may include a memory cell array 20 and a peripheral circuit 30. The peripheral circuit 30 may include a row decoder 32, a page buffer 34, an input and output buffer 35, a control logic 36, and a voltage generator 37.

The memory cell array 20 may include a plurality of memory blocks, and each of the memory blocks may include a plurality of memory cells. The plurality of memory cells may be connected to the row decoder 32 through a string select line SSL, word lines WL, and first and second ground select lines GSL1 and GSL2, and may be connected to the page buffer 34 through bit lines BL. In example embodiments, a plurality of memory cells arranged in the same row may be connected to the same word line WL, and a plurality of memory cells arranged in the same column may be connected to the same bit line BL.

The row decoder 32 may decode an input address ADDR and may generate and transfer driving signals of the word lines WL. The row decoder 32 may provide a word line voltage generated from the voltage generator 37 to a selected word line WL and non-selected word lines WL in response to the control logic 36 (e.g., under the control of the control logic 36). The control logic 36 may also be referred to as a control logic circuit. The row decoder 32 may also provide select line voltages generated from the voltage generator 37 to the string select line SSL and the first and second ground select lines GSL1 and GSL2. The row decoder 32 may include first to fourth circuits 32a, 32b, 32c, and 32d which are controlled independently. The first circuit 32a may provide a voltage applied to the string select line SSL, the second circuit 32b may provide a voltage applied to the second ground select line GSL2, the third circuit 32c may provide a voltage applied to the word lines WL, and the fourth circuit 32d may provide a voltage applied to the first ground select line GSL1. Thus, the string select line SSL, the word lines WL, and the first and second ground select lines GSL1 and GSL2 may receive voltages independently through the first to fourth circuits 32a, 32b, 32c, and 32d in accordance with an operational mode of the memory cell array 20.

The page buffer 34 may be connected to the memory cell array 20 through the bit lines BL, and may read information stored in the memory cells. The page buffer 34 may temporarily store data to be stored in the memory cells or may sense data stored in the memory cells depending on an operational mode. The page buffer 34 may include a column decoder and a sense amplifier. The column decoder may selectively activate the bit lines BL of the memory cell array 20, and the sense amplifier may sense the voltage of a bit line BL selected by the column decoder and may read data stored in a selected memory cell in a reading operation.

The input and output buffer 35 may receive data DATA and may transfer the data to the page buffer 34 in a program operation, and may output the data DATA received from the page buffer 34 to an external entity (e.g., a device external to the semiconductor device 10) in a reading operation. The input and output buffer 35 may transfer an input address or an input command to the control logic 36.

The control logic 36 may control operations of the row decoder 32 and the page buffer 34. The control logic 36 may receive a control signal and an external voltage transferred from an external entity, and may operate in accordance with the received control signal. The control logic 36 may control a reading operation, a writing operation, and/or an erasing operation in response to the control signals.

The voltage generator 37 may generate voltages used for internal operations, such as a program voltage, a read voltage, an erase voltage, etc., for example, using an external voltage. The voltages generated in the voltage generator 37 may be transferred to the memory cell array 20 through the row decoder 32.

Figure 2A:
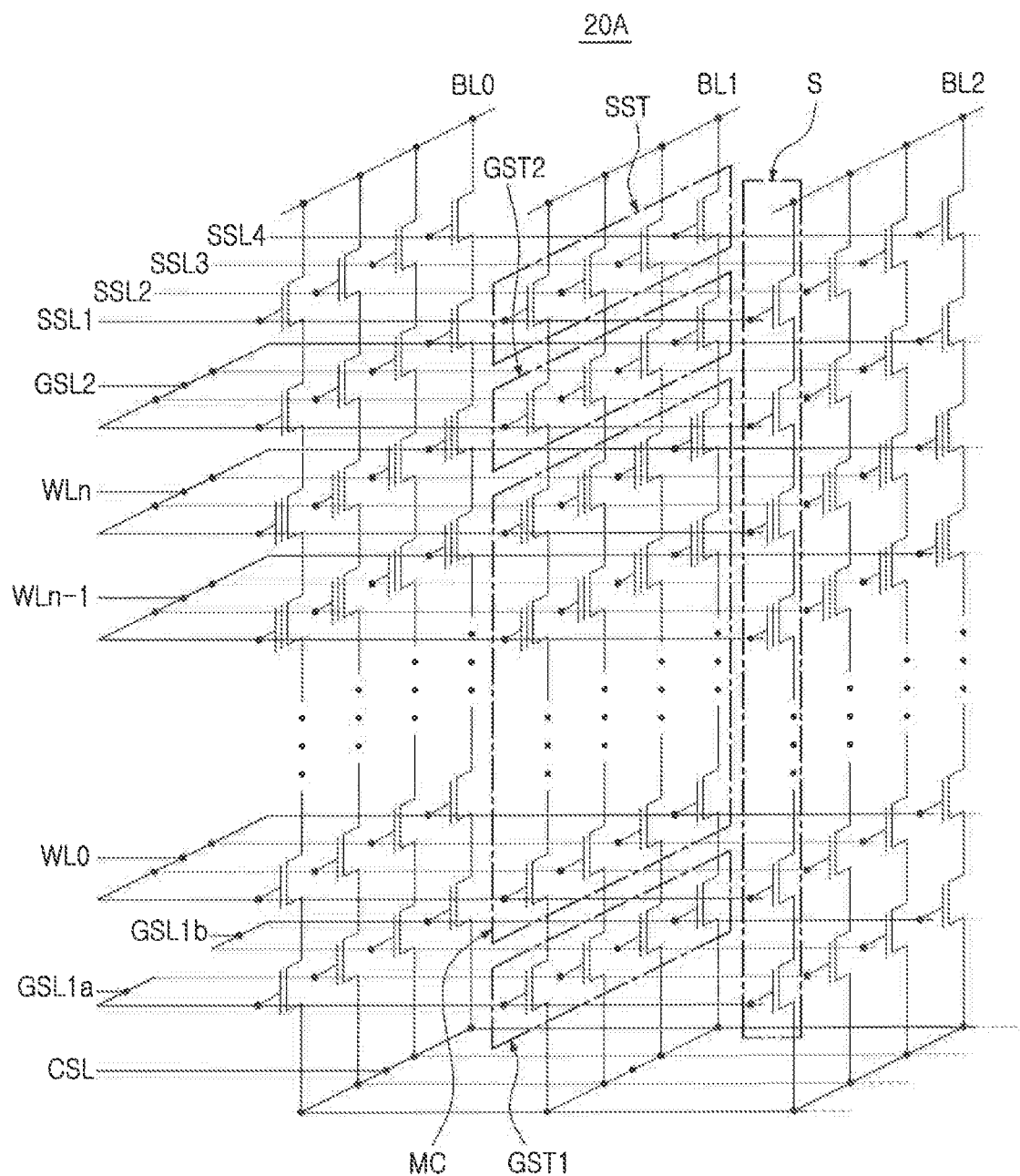
FIGS. 2A and 2B are equivalent circuit diagrams of a cell array of a semiconductor device according to an example embodiment of the present inventive concept.
Figure 2B:
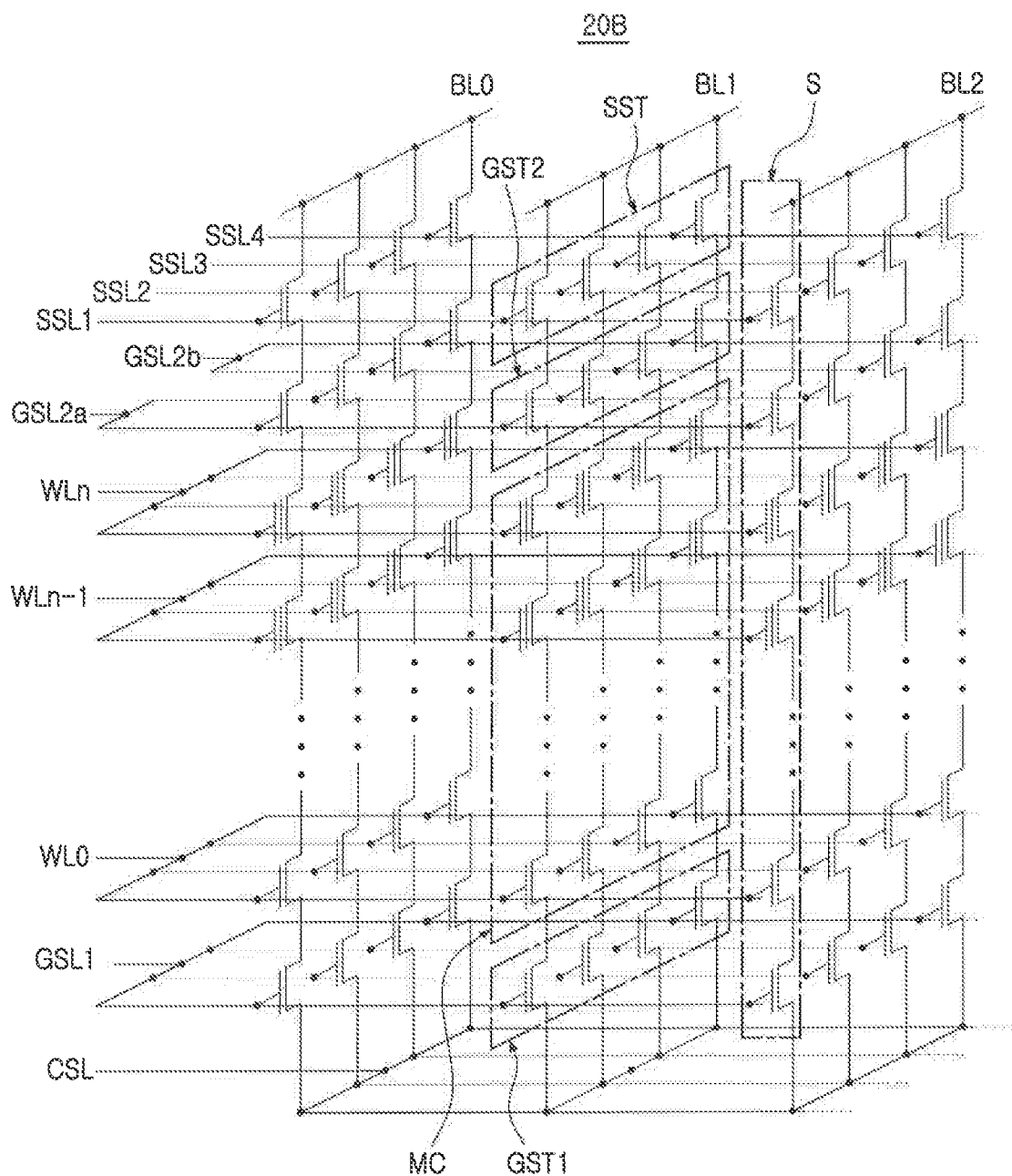

FIGS. 2A and 2B are equivalent circuit diagrams of a cell array of a semiconductor device according to an example embodiment.

Referring to FIG. 2A, a memory cell array 20A may include a plurality of NAND memory cell strings S including memory cells MC connected to each other in series, first and second ground select transistors GST1 and GST2 connected to both ends of the memory cells MC in series, and string select transistors SST. In the memory cell strings S, the first and second ground select transistors GST1 and GST2 may respectively be connected to both ends of the memory cells MC in series, and the string select transistor SST may be connected to one end of the second ground select transistor GST2.

The plurality of memory cell strings S may be connected to respective bit lines BL0 to BL2 in parallel. The plurality of memory cell strings S may be connected to a common source line CSL in common. For example, the plurality of memory cell strings S may be disposed between the plurality of bit lines BL0 to BL2 and the single common source line CSL. In example embodiments, a plurality of common source lines CSL may be arranged two-dimensionally.

The memory cells MC connected to each other in series may be controlled by word lines WL0 to WLn for selecting the memory cells MC, in which n is a positive integer. The memory cells MC each may include a data storage element. Gate electrodes of the memory cells MC disposed at substantially the same distance from the common source line CSL may be connected to one of the word lines WL0 to WLn in common and may be in an equipotential state. Alternatively, even when the gate electrodes of the memory cells MC1 and MC2 are disposed at substantially the same distance from first and second common source lines, the gate electrodes disposed in different rows or columns may be controlled independently.

The first ground select transistor GST1 may be controlled by first ground select lines GSL1a and GSL1b and may be connected to the common source line CSL. The second ground select transistor GST2 may be controlled by a second ground select line GSL2 and may be connected to the memory cells MC and the string select transistors SST. The first and second ground select lines GSL1a, GSL1b, and GSL2 may control electrical connections between the memory cell strings S and the common source line CSL. The string select transistors SST may be controlled by string select lines SSL1 to SSL4, and may be connected to the bit lines BL0 to BL2. The string select lines SSL1 to SSL4 may control electrical connections between the memory cell strings S and the bit lines BL0 to BL2. In example embodiments, each of the first ground select lines GSL1a and GSL1b may be disposed to correspond to a plurality of string select lines among the string select lines SSL1 to SSL4. For example, in an example embodiment, the first ground select lines GSL1a and GSL1b may be disposed to correspond to two string select lines among the string select lines SSL1 to SSL4. For example, a plurality of the first ground select lines GSL1a and GSL1b may be provided to word lines WL0 to WLn.

FIG. 2A illustrates an exemplary structure in which a single first ground select transistor GST1, a single second ground select transistor GST2, and a single string select transistor SST are respectively connected to the plurality of memory cells MC connected to each other in series. However, example embodiments of the inventive concept are not limited thereto. For example, in an example embodiment, a plurality of at least one of the first ground select transistor GST1, the second ground select transistor GST2, and the string select transistor SST may be connected to the plurality of memory cells MC. In example embodiments, one or more dummy words lines may also be disposed between an uppermost word line WLn among the word lines WL0 to WLn and a second ground select line GSL2. In example embodiments, one or more dummy word lines may also be disposed between a lowermost word line WL0 and the first ground select lines GSL1a and GSL1b and/or between the second ground select line GSL2 and the string select lines SSL1 to SSL4.

When a signal is applied to the string select transistor SST through the string select lines SSL1 to SSL4, a signal applied through the bit lines BL0 to BL2 may be transferred to the memory cells MC connected to each other in series, such that operations of reading and writing data may be performed. Also, as a certain level of erase voltage is applied through a substrate, an operation of erasing data written in the memory cells MC may be performed. The memory cell array 20 may include at least one dummy memory cell string electrically isolated from the bit lines BL0 to BL2. The dummy cell strings may be connected to the common source line CSL and/or the substrate and may be used as contact plugs (e.g., paths for electrical connection).

Referring to FIG. 2B, in a memory cell array 20B, a first ground select transistor GST1 may be controlled by a first ground select line GSL1, and may be connected to a common source line CSL. A second ground select transistor GST2 may be controlled by second ground select lines GSL2a and GSL2b, and may be connected to memory cells MC and a string select transistor SST. In an example embodiment, the first ground select line GSL1 may be disposed to correspond to a plurality of string select lines among the string select lines SSL1 to SSL4 (e.g., four string select lines), and the single first ground select line GSL1 may be provided to the word lines WL0 to WLn. The second ground select lines GSL2a and GSL2b may be disposed to correspond to a plurality of string select lines among the string select lines SSL1 to SSL4 (e.g., two string select lines), respectively. For example, a plurality of the second ground select lines GSL2a and GSL2b may be provided to the word lines WL0 to WLn. In example embodiments, however, a plurality of the first ground select lines GSL1 may also be provided as shown in FIG. 2A. For example, first ground select lines GSL1 may be provided to correspond to the second ground select lines GSL2a and GSL2b.

Figure 3:
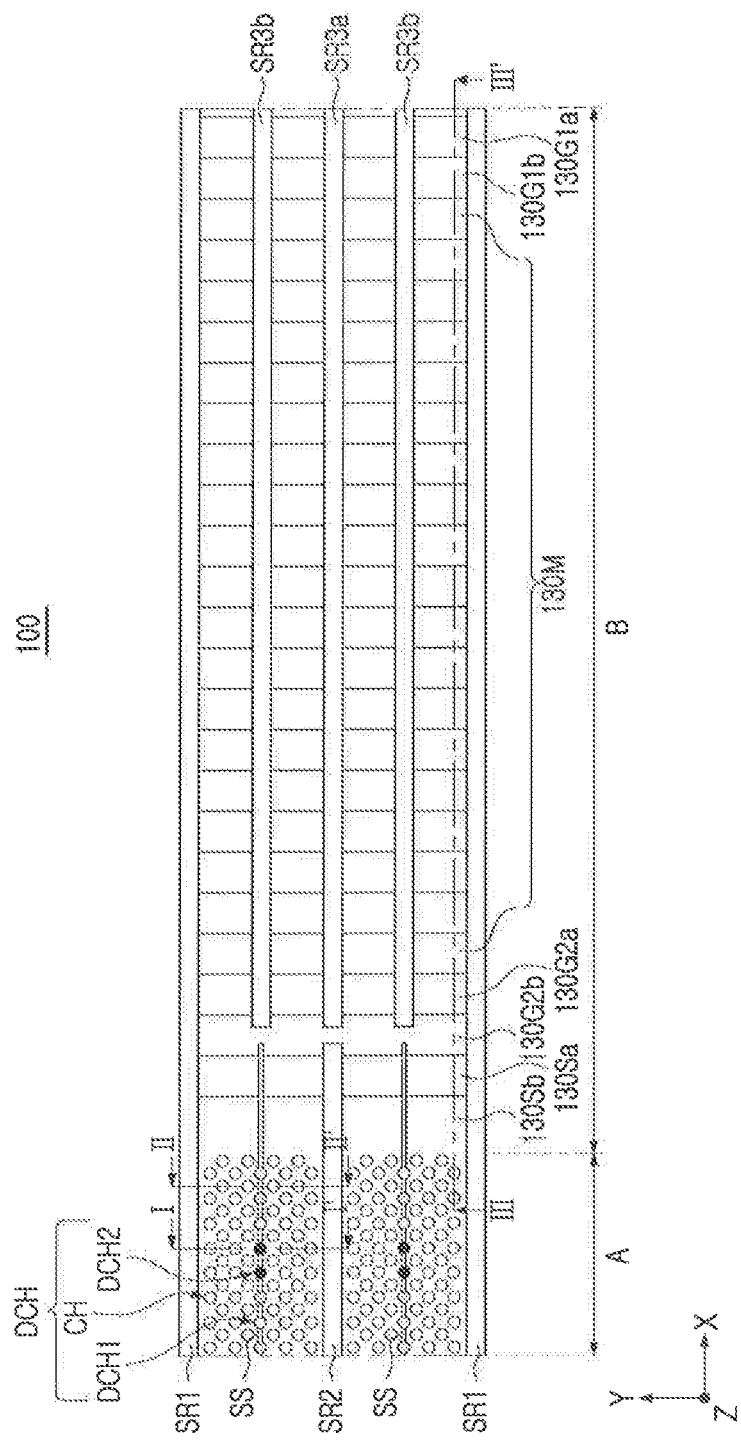
FIG. 3 is a schematic plan diagram illustrating a semiconductor device according to an example embodiment of the present inventive concept.

FIG. 3 is a schematic plan diagram illustrating a semiconductor device according to an example embodiment. For convenience of illustration, some elements are omitted from FIG. 3.

Figure 4A:
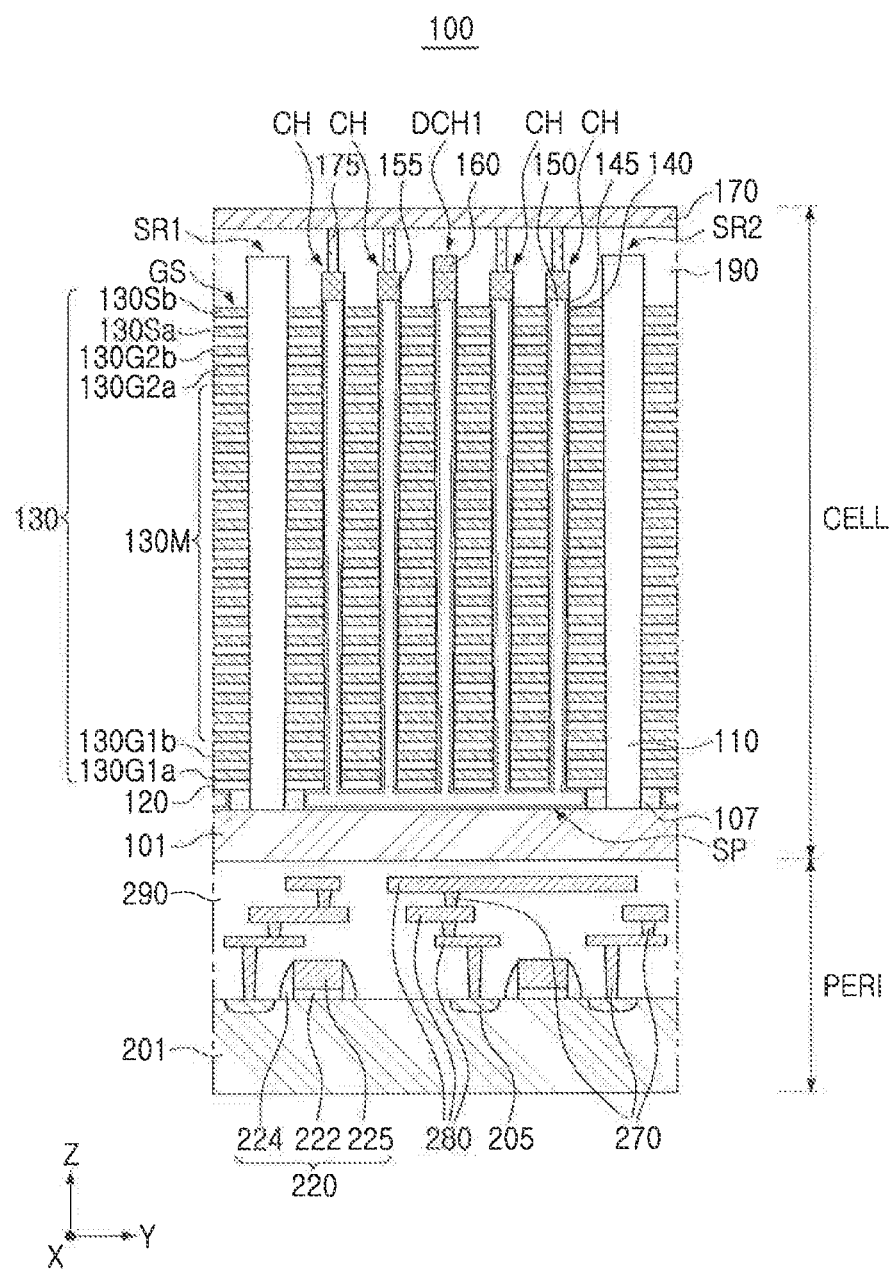
FIGS. 4A to 4C are schematic cross-sectional diagrams illustrating a semiconductor device according to an example embodiment of the present inventive concept.
Figure 4B:
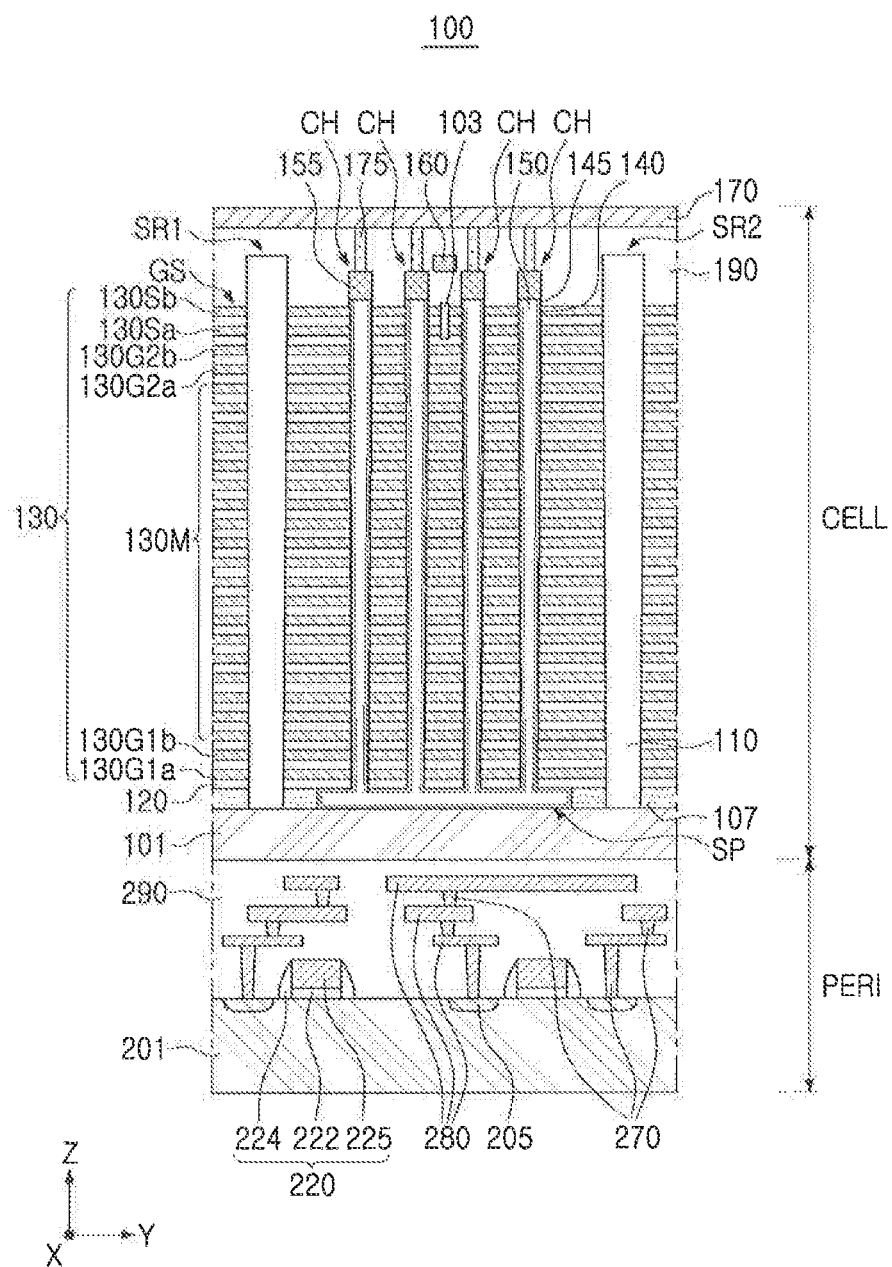
Figure 4C:
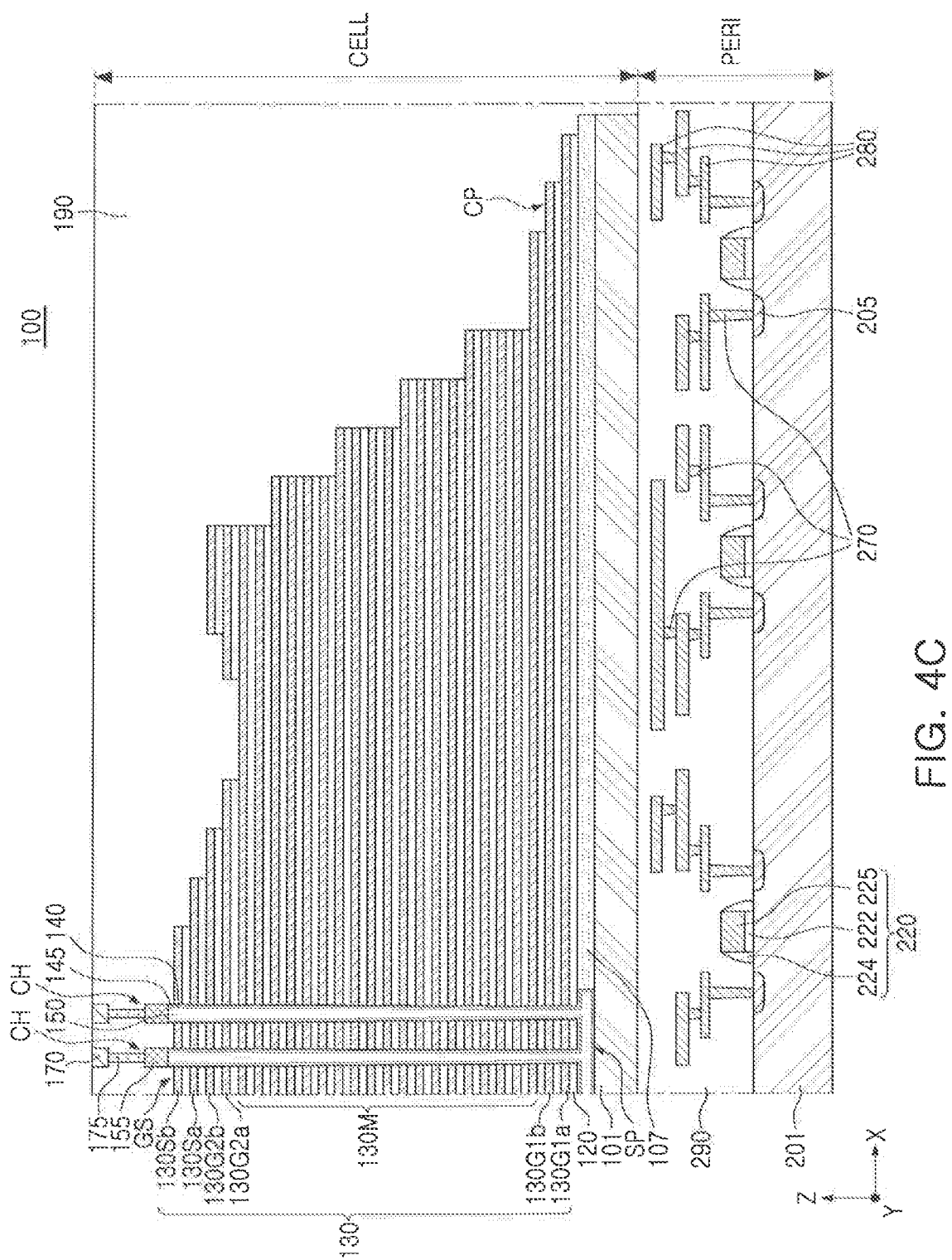

FIGS. 4A to 4C are schematic cross-sectional diagrams illustrating a semiconductor device according to an example embodiment. FIGS. 4A to 4C illustrate cross-sections taken along lines I-I', II-II', and III-III' of FIG. 3, respectively.

Referring to FIGS. 3 and 4A to 4C, a semiconductor device 100 may include a memory cell region CELL and a peripheral circuit region PERI. The memory cell region CELL may be disposed on an upper end of the peripheral circuit region PERI. In example embodiments, the memory cell region CELL may also be disposed on a lower end of the peripheral circuit region PERI.

The memory cell region CELL may include a substrate 101 having first region A and second region B, gate electrodes 130 stacked on the substrate 101, first to third separation regions SR1, SR2, SR3a, and SR3b extending and penetrating through a stack structure GS of the gate electrodes 130, upper insulating regions SS penetrating a portion of an upper portion of the stack structure GS, channels CH and dummy channels DCH1 and DCH2 penetrating the stack structure GS, and a horizontal portion SP disposed on the substrate 101 and including a region in which a channel region 140 extends horizontally. The horizontal portion SP may be disposed in lower portions of the gate electrodes 130 and may connect lower portions of adjacent channels CH to each other. The separation regions SR3a and SR3b may be referred to as a third separation region(s). The dummy channels DCH1 and DCH2 may be generally referred to as dummy channels DCH. The memory cell region CELL may further include the channel regions 140 in the channels CH and the dummy channels DCH1 and DCH2, a gate dielectric layer 145, a channel insulating layer 150, and a channel pad 155, and may also include a horizontal filling layer 107 disposed in an outer portion of the horizontal portion SP, interlayer insulating layers 120 stacked alternately with the gate electrodes 130 on the substrate 101, a source line 160 and a bit line 170 disposed on the stack structure GS, contact plugs 175, and a cell region insulating layer 190.

As shown in FIG. 3, the dummy channels DCH1 and DCH2 may be disposed in the same line in an x direction. For example, the dummy channels DCH1 and DCH2 may be aligned with each other in an x direction.

The first region A of the substrate 101 may be a region in which the gate electrodes 130 are stacked vertically and in which the channels CH and the dummy channels DCH1 and DCH2 are disposed. The first region A may correspond to the memory cell array 20 illustrated in FIG. 1. The second region B may be a region in which the gate electrodes 130 extend by different lengths, and may be a region for electrically connecting the memory cell array 20 illustrated in FIG. 1 to a peripheral circuit 30. For example, in the second region B, the gate electrodes 130 may be disposed in a step formation, resulting in the gate electrodes 130 extending by different lengths. For example, as shown in FIG. 4C, the gate electrodes 130 may be spaced apart from each other and stacked in a z direction perpendicular to an upper surface of the substrate 101, and may extend by different lengths in an x direction perpendicular to the z direction. The second region B may be disposed on at least one end of the first region A in at least one direction (e.g., in an x direction).

The substrate 101 may have an upper surface extending in an x direction and a y direction. The substrate 101 may include a semiconductor material such as, for example, a group IV semiconductor or a group III-V compound semiconductor. A group IV semiconductor may include, for example, silicon, germanium, or silicon-germanium. The substrate 101 may be provided, for example, as a polycrystalline silicon layer or an epitaxial layer.

The gate electrodes 130 may be spaced apart from each other and stacked vertically on the substrate 101 and may form the stack structure GS. The gate electrodes 130 may include first ground select electrodes 130G1a and 130G1b included in a gate of the first ground select transistor GST1 illustrated in FIGS. 2A and 2B, memory cell electrodes 130M included in a plurality of memory cells MC, second ground select electrodes 130G2a and 130G2b included in a gate of a second ground select transistor GST2, and string select electrodes 130Sa and 130Sb included in a gate of a string select transistor SST. The semiconductor device 100 may control the electrical connection between a common source line CSL and the memory cell MC by the first ground select transistor GST1, and may also control the electrical connection in a program operation by the second ground select transistor GST2 disposed adjacent to the common source line CSL or the source line 160. The configuration above will be described in greater detail below with reference to FIGS. 6A and 6B. The string select electrodes 130Sa and 130Sb may be disposed in an uppermost portion among the gate electrodes 130.

The number of the memory cell electrodes 130M included in the memory cells MC may be determined depending on the capacity of the semiconductor device 100. In example embodiments, the number of the first ground select electrodes 130G1a and 130G1b, the number of the second ground select electrodes 130G2a and 130G2b, and the number of the string select electrodes 130Sa and 130Sb each may be one or two or more, and the first ground select electrodes 130G1a and 130G1b, the second ground select electrodes 130G2a and 130G2b, and the string select electrodes 130Sa and 130Sb may have structures the same as or different from structures of the memory cell electrodes 130M. Portions of the gate electrodes 130 (e.g., the memory cell electrodes 130M adjacent to the first ground select electrodes 130G1a and 130G1b and the second ground select electrodes 130G2a and 130G2b) may be dummy gate electrodes.

The gate electrodes 130 may be spaced apart from each other and stacked vertically in the first region A, and may extend to the second region B from the first region A by different lengths such that the gate electrodes 130 may form stepped portions having a staircase shape. The gate electrodes 130 may form the stepped portions in the x direction as illustrated in FIG. 4C, and similarly, the gate electrodes 130 may also form stepped portions on ends in a y direction. Due to the inclusion of the stepped portions, the gate electrodes 130 in a lower portion may extend further than the gate electrodes 130 in an upper portion such that the gate electrodes 130 may provide contact regions CP exposed to an upper portion, as shown in FIG. 4C. The gate electrodes 130 may be connected to contact plugs in the contact regions CP and may be connected to wiring lines disposed in an upper portion. At least a certain number of the memory cell electrodes 130M other than the select electrodes 130G1a, 130G1b, 130G2a, 130G2b, 130Sa, and 130Sb among the gate electrodes 130 (e.g., four memory cell electrodes 130M) may form a single stack structure, and may form stepped portions between the stack structures. The four memory cell electrodes 130M forming a single stack structure may have stepped portions in a y direction.

As illustrated in FIG. 3, the gate electrodes 130 may be completely isolated from each other by a certain unit in the y direction by the first separation regions SR1 extending in the x direction. The gate electrodes 130 between a pair of the first separation regions SR1 may form a single memory block. However, a range of the memory block is not limited thereto. Portions of the gate electrodes 130 (e.g., each of the memory cell electrodes 130M) may form a single layer in a single memory block.

The gate electrodes 130 may include a metal material such as, for example, tungsten (W). In example embodiments, the gate electrodes 130 may include polycrystalline silicon or a metal silicide material. In example embodiments, the gate electrodes 130 may further include a diffusion barrier, and the diffusion barrier may include, for example, tungsten nitride (WN), tantalum nitride (TaN), titanium nitride (TiN), or combinations thereof.

The interlayer insulating layers 120 may be disposed between the gate electrodes 130. The interlayer insulating layers 120 may also be spaced apart from each other in a direction perpendicular to an upper surface of the substrate 101 and may extend in the x direction, similarly to the gate electrodes 130. The interlayer insulating layers 120 may include an insulating material such as, for example, silicon oxide or silicon nitride.

The first to third separation regions SR1, SR2, SR3a, and SR3b may penetrate through the gate electrodes 130 and extend in the x direction in the first region A and the second region B. The first to third separation regions SR1, SR2, SR3a, and SR3b may be disposed side by side or in parallel to each other. The second separation region SR2 may extend from the first region A of the substrate 101 in parallel to the first separation regions SR1 between a pair of the first separation regions SR1. The third separation regions SR3a and SR3b may be disposed in parallel between a pair of the first separation regions SR1 in the second region B of the substrate 101. The third separation region SR3a in a central portion may be spaced apart from the second separation region SR2 in the x direction and may be disposed side by side to the second separation region SR2. The other third separation regions SR3*b* may be disposed in parallel to the first separation regions SR1 between the third separation region SR3*a* and the first separation regions SR1. The first to third separation regions SR1, SR2, SR3*a*, and SR3*b* may penetrate through the overall gate electrodes 130 stacked on the substrate 101 and may be connected to the substrate 101.

Separation insulating layers 110 may be disposed in the first to third separation regions SR1, SR2, SR3*a*, and SR3*b*. The separation insulating layer 110 may have a shape in which a width of the separation insulating layer 110 decreases towards the substrate 101 due to a relatively high aspect ratio. For example, in an example embodiment, the width of the separation insulating layer 110 at an uppermost end thereof furthest from the substrate 101 may be greater than the width of the separation insulating layer 110 at a lowermost end thereof closest to the substrate 101, and the width of the separation insulating layer 110 may gradually decrease from the uppermost end to the lowermost end. However, example embodiments are not limited thereto. The separation insulating layer 110 may have side surfaces perpendicular to an upper surface of the substrate 101. The separation insulating layer 110 may include an insulating material such as, for example, silicon oxide, silicon nitride, etc.

The upper insulating regions SS may extend in the x direction between the first separation regions SR1 and the second separation region SR2. The upper insulating regions SS may be disposed side by side to portions of the third separation regions SR3*b*. The upper insulating regions SS may be disposed in a portion of the second region B and in the first region A to penetrate through portions of the gate electrodes 130 including the string select electrodes 130Sa and 130Sb among the gate electrodes 130. The string select electrodes 130Sa and 130Sb isolated by the upper insulating regions SS and the second separation region SR2 may form different string select lines SSL1 to SSL4 (see FIGS. 2A and 2B). In an example embodiment, the upper insulating regions SS may isolate two gate electrodes 130 including string select electrodes 130Sa and 130Sb from each other in the y direction. The number of the gate electrodes 130 isolated from each other by the upper insulating regions SS may vary in example embodiments. For example, the upper insulating regions SS may extend to the upper second ground select electrode 130G2*b* from an upper portion. Also, in example embodiments, in a case in which a dummy gate electrode is disposed in lower portions of the string select electrodes 130Sa and 130Sb, the upper insulating regions SS may extend to at least a portion of the dummy gate electrode from an upper portion. The upper insulating regions SS may include an upper separation insulating layer 103 (see FIG. 4B).

In example embodiments, the semiconductor device 100 may further include a lower separation insulating layer isolating the first ground select electrodes 130G1*a* and 130G1*b* among the gate electrodes 130. For example, the lower separation insulating layer may be disposed such that it separates the first ground select electrodes 130G1*a* and 130G1*b* in a region between the second separation region SR2 and the third separation region SR3*a* disposed in the same line in the x direction.

It will be understood that the terms "first," "second," "third," etc. are used herein to distinguish one element from another, and the elements are not limited by these terms. Thus, a "first" element in an example embodiment may be described as a "second" element in another example embodiment.

The channels CH and the dummy channels DCH1 and DCH2 may be spaced apart from each other and disposed in the first region A while forming rows and columns. In example embodiments, the dummy channels DCH1 and DCH2 may be referred to as second channels, or second and third channels, respectively, in consideration of a relationship with the channels CH, which may be referred to as first channels. The channels CH and the dummy channels DCH1 and DCH2 may be disposed in grid form or may be disposed in a zig-zag form in one direction. The channels CH and the dummy channels DCH1 and DCH2 may have column shapes, and may have inclined side surfaces narrowing towards the substrate 101 in accordance with an aspect ratio.

In example embodiments, the channels CH provide the memory cell string S illustrated in FIGS. 2A and 2B along with the gate electrodes 130, and the dummy channels DCH1 and DCH2 do not provide the memory cell string S. For example, in example embodiments, the dummy channels DCH1 and DCH2 are not included in a memory cell, and are used as a path for an electrical connection. The channels CH and the dummy channels DCH1 and DCH2 may have the same shape, however, impurities included in some of internal elements thereof and/or wiring structures disposed in upper portions thereof may be different. In example embodiments, the dummy channels may also be disposed in the second region B and ends of the first region A adjacent to the second region B.

In example embodiments, the dummy channels DCH1 and DCH2 may be disposed in the same line along the upper insulating regions SS. In example embodiments, the dummy channels DCH1 and DCH2 may be aligned with each other along the upper insulating regions SS. Portions of side surfaces of the dummy channels DCH1 and DCH2 may be in contact with the upper separation insulating layer 103 of the upper insulating region SS. The first dummy channels DCH1 and the second dummy channels DCH2 may be disposed alternately with each other while forming a certain pattern. For example, m number of the first dummy channels DCH1 and n number of the second dummy channels DCH2 may be alternately disposed, in which m and n are positive integers and m≥n. The arrangement of the dummy channels DCH1 and DCH2 is not limited to the example illustrated in FIG. 3. For example, in example embodiments, the dummy channels DCH1 and DCH2 may be divided in a respective row.

The first dummy channels DCH1 may be connected to the source line 160 in an upper portion as illustrated in FIG. 4A and may function as a contact plug of the common source line CSL. Thus, when a reading operation of the semiconductor device 100 is performed, electrons may move from the channel regions 140 in the channels CH to the source line 160 through the horizontal portion SP and the channel regions 140 in the first dummy channels DCH1. In example embodiments, a connection wiring structure such as a contact plug may also be disposed between the first dummy channels DCH1 and the source line 160.

The second dummy channels DCH2 may be connected to the source line 160 or a wiring line in a region not illustrated. In a case in which the first dummy channels DCH1 and the second dummy channels DCH2 are connected to a single wiring line, different first and second operation voltages may be applied when a program operation and a reading operation is performed, respectively, and when an erasing operation is performed, an erase voltage may be applied. In a case in which the second dummy channels DCH2 are connected to a separated wiring line from the first dummy channels DCH1, the second dummy channels DCH2 may function as a contact plug of a body or a well when an erase voltage is applied to memory cell strings. For example, when an erasing operation of the semiconductor device 100 is performed, a hole may move to the channel region 140 in the channels CH through the channel region 140 in the second dummy channels DCH2 and the horizontal portion SP.

The channels CH may be electrically connected to the bit line 170 via the contact plug 175. The channel regions 140 may be disposed in the channels CH. In example embodiments, the channel region 140 in the channel CH may have an annular shape (e.g., a ring shape) surrounding the channel insulating layer 150 disposed in the channel region 140. However, example embodiments of the inventive concept are not limited thereto. For example, in example embodiments, the channel region 140 may have a column shape such as a cylinder or a prism without the channel insulating layer 150. The channel region 140 may include a semiconductor material such as, for example, polycrystalline silicon or single crystal silicon, and the semiconductor material may be an undoped material, or a material including p-type impurities or n-type impurities. The channels CH disposed in the same line in the y direction between the first or second separation regions SR1 and SR2 and the upper insulating regions SS may respectively be connected to different bit lines BL0 to BL2 (see FIGS. 2A and 2B) depending on the arrangement of an upper wiring structure connected to the channel pad 155.

The channel pads 155 may be disposed in an upper portion of the channel region 140 in the channels CH. The channel pads 155 may cover an upper surface of the channel insulating layer 150 and may be electrically connected to the channel region 140. The channel pads 155 may include, for example, doped polycrystalline silicon.

The gate dielectric layer 145 may be disposed between the gate electrodes 130 and the channel region 140. The gate dielectric layer 145 may include a tunneling layer, a charge storage layer, and a blocking layer stacked sequentially from the channel region 140. The tunneling layer may tunnel an electric charge to the charge storage layer, and may include, for example, silicon oxide ($SiO_2$), silicon nitride ($Si_3N_4$), silicon oxynitride (SiON), or combinations thereof. The charge storage layer may be a charge trap layer or a floating gate conductive layer. The blocking layer may include, for example, silicon oxide ($SiO_2$), silicon nitride ($Si_3N_4$), silicon oxynitride (SiON), a high-k material, or combinations thereof. In example embodiments, at least a portion of the gate dielectric layer 145 may extend in a horizontal direction along the gate electrodes 130.

The dummy channels DCH1 and DCH2 may have internal structures the same as structures of the channels CH. However, in example embodiments, the channel pads 155 in the channels CH and the dummy channels DCH1 may include first conductivity-type impurities, and the channel pads 155 in the second dummy channels DCH2 may include second conductivity-type impurities. It is to be understood that example embodiments of the inventive concept are not limited thereto. The first conductivity-type impurities may be, for example, n-type impurities including, for example, phosphorus (P), arsenic (As), etc. The second conductivity-type impurities may be, for example, p-type impurities including, for example, boron (B), aluminum (Al), etc.

The horizontal portion SP and the horizontal filling layer 107 may be disposed in a lower portion of the stack structure GS of the gate electrodes 130 on the substrate 101. The horizontal portion SP may be connected to the channels CH and the dummy channels DCH1 and DCH2, and may be disposed in parallel to an upper surface of the substrate 101 such that the horizontal portion SP may have a connected structure between at least portions of the channels CH and the dummy channels DCH1 and DCH2. The horizontal portions SP may be connected to each other between the channels CH and the dummy channels DCH1 and DCH2 disposed between two separation insulating layers 110 adjacent to each other in the y direction and may extend in the x direction. However, example embodiments of the inventive concept are not limited thereto.

The horizontal portions SP may have circular shapes surrounding the channels CH and the dummy channels DCH1 and DCH2 on lower ends, and may have plate shapes connected to each other between at least portions of the channels CH and the dummy channels DCH1 and DCH2. However, a shape of the horizontal portion SP may vary in example embodiments. In example embodiments, the horizontal filling layer 107 on side surfaces of the horizontal portion SP may be omitted. In example embodiments, at least a portion of the horizontal portion SP may be disposed within the substrate 101.

The horizontal portion SP may include portions of the channel region 140, the gate dielectric layer 145, and the channel insulating layer 150. For example, the horizontal portion SP may be formed as the channel region 140, the gate dielectric layer 145, and the channel insulating layer 150 extend in a horizontal direction from the channels CH and the dummy channels DCH1 and DCH2. The gate dielectric layer 145 may be disposed in an outer region of the horizontal portion SP, and an internal region of the horizontal portion SP may be filled with the channel insulating layer 150.

The horizontal filling layer 107 may fill a space between the horizontal portion SP and the separation insulating layer 110, and may be disposed in parallel to the horizontal portion SP. For example, the horizontal filling layer 107 may form a single layer in parallel to an upper surface of the substrate 101 along with the horizontal portion SP. The horizontal filling layer 107 may be formed of, for example, a conductive material or a semiconductor material. However, the material of the horizontal filling layer 107 is not limited thereto.

The source line 160 may be connected to at least portions of the dummy channels DCH1 and DCH2. For example, in an example embodiment, the source line 160 is connected to at least portions of the first dummy channels DCH1. The source line 160 may be electrically insulated with the bit line 170, and may extend in a direction perpendicular to the bit line 170 in a lower portion of the bit line 170. However, example embodiments of the inventive concept are not limited thereto.

The contact plugs 175 may respectively be disposed in upper portions of the channels CH, and may connect the channel pads 155 to the bit line 170. In example embodiments, the contact plugs 175 may have a shape in which widths of the contact plugs 175 decrease towards lower portions thereof.

The bit line 170 may extend in the y direction, and may be connected to each of the channels CH between the upper insulating regions SS and the first and second separation regions SR1 and SR2. In example embodiments, an additional wiring structure for the above described connection may also be disposed in a lower portion of the bit line 170.

The source line 160, the contact plugs 175, and the bit line 170 may include a conductive material such as, for example, a metal. For example, the source line 160, the contact plugs 175, and the bit line 170 may include tungsten (W), copper (Cu), aluminum (Al), etc.

The cell region insulating layer 190 may cover the substrate 101, the gate electrodes 130 on the substrate 101, and a peripheral region insulating layer 290. The cell region insulating layer 190 may be formed of an insulating material.

The peripheral circuit region PERI may include a base substrate 201, circuit devices 220 disposed on the base substrate 201, circuit contact plugs 270, and circuit wiring lines 280.

The base substrate 201 may have an upper surface extending in the x direction and the y direction. The base substrate 201 may include device separation layers such that an active region may be defined. Source/drain regions 205 including impurities may be disposed in a portion of the active region. The base substrate 201 may include a semiconductor material such as, for example, a group IV semiconductor, a group III-V compound semiconductor, or a group II-VI compound semiconductor.

The circuit devices 220 may include a planar transistor. Each of the circuit devices 220 may include, for example, a circuit gate dielectric layer 222, a spacer layer 224, and a circuit gate electrode 225. The source/drain regions 205 may be disposed in the base substrate 201 on both sides of the circuit gate electrode 225.

The peripheral region insulating layer 290 may be disposed on the circuit device 220 on the base substrate 201. The circuit contact plugs 270 may penetrate through the peripheral region insulating layer 290 and may be connected to the source/drain regions 205. An electrical signal may be applied to the circuit devices 220 by the circuit contact plugs 270. In a region not illustrated, the circuit contact plugs 270 may also be connected to the circuit gate electrode 225. The circuit wiring lines 280 may be connected to the circuit contact plugs 270, and may be provided as a plurality of layers.

Figure 5A:
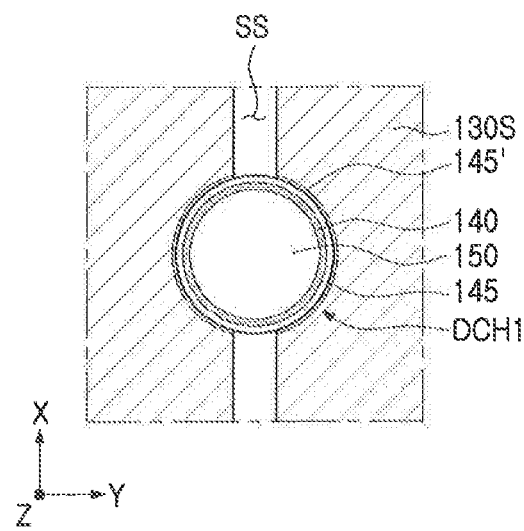
FIGS. 5A and 5B are diagrams illustrating a gate electrode according to an example embodiment of the present inventive concept.
Figure 5B:
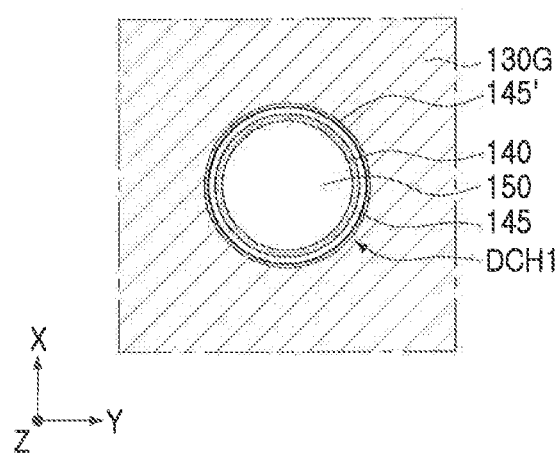

FIGS. 5A and 5B are diagrams illustrating a gate electrode according to an example embodiment.

FIGS. 5A and 5B illustrate cross-sections on an x-y plane of a string select electrode 130S and a ground select electrode 130G, respectively, surrounding the first dummy channel DCH1. The string select electrode 130S may be string select electrodes 130Sa and 130Sb illustrated in FIGS. 3 and 4A to 4C, and the ground select electrode 130G may be first and second ground select electrodes 130G1a, 130G1b, 130G2a, and 130G2b, and particularly, second ground select electrodes 130G2a and 130G2b. In the first dummy channel DCH1, a gate dielectric layer 145, a channel region 140, and a channel insulating layer 150 may be disposed sequentially from an outer region. A portion of a blocking layer 145' (e.g., a portion of the gate dielectric layer) may also be disposed in an outer region of the first dummy channel DCH1.

The string select electrode 130S may be divided by an upper insulating region SS, as illustrated in FIG. 5A, and may thus include portions separated from each other in the y direction with reference to the first dummy channel DCH1. Accordingly, in example embodiments, the first dummy channels DCH1 are not completely surrounded by the string select electrode 130S (the gate electrode 130), and at least a portion of side surfaces may be in contact with the upper separation insulating layer 103 in the upper insulating regions SS. Therefore, in example embodiments, the channel region 140 in the first dummy channels DCH1 does not receive an effect generated by voltage of the string select electrode 130S in a region adjacent to the upper insulating regions SS. Accordingly, even when a voltage that may turn off a transistor is applied to string select lines SSL1 and SSL2 (see FIGS. 2A and 2B), a string select transistor SST may not maintain a complete off-state.

In example embodiments, the string select electrode 130S may be divided by both the upper insulating region SS and the first dummy channel DCH1. For example, the string select electrode 130S may be divided by the upper insulating region SS in areas in which the first dummy channel DCH1 is not disposed, and the string select electrode 130S may be divided by the first dummy channel DCH1 in areas in which the first dummy channel DCH1 is disposed. In areas in which the first dummy channel DCH1 is disposed, the string select electrode 130S may extend along opposite outer boundaries of the first dummy channel DCH1, and the portions extending along the outer boundaries do not contact each other.

In example embodiments, the ground select electrode 130G surrounding the first dummy channels DCH1 is not divided by the upper insulating region SS, as illustrated in FIG. 5B. Thus, in example embodiments, the ground select electrode 130G is completely surrounded by the ground select electrode 130G (the gate electrode 130). For example, the ground select electrode 130G may completely surround side surfaces of the first dummy channel DCH1. The string select electrode 130S and the ground select electrode 130G surrounding channels CH may also have structures described above.

Thus, depending on an applied voltage, ground select transistors GST1 and GST2 may maintain a complete off-state. As illustrated in FIGS. 4A to 4C, a structure of the second ground select transistor GST2 formed by the second ground select electrodes 130G2a and 130G2b disposed in lower portions of string select electrodes 130Sa and 130Sb may be different from a structure of the string select transistor SST including the string select electrodes 130Sa and 130Sb in an upper portion. Thus, differently from the string select transistor SST, the second ground select transistor GST2 may be completely turned off in accordance with a voltage applied to the gate electrode 130. Due to the above described properties, the first dummy channels DCH1 may maintain a boosting state when a programming operation of the semiconductor device is performed. The configuration above will be described in greater detail below with reference to FIGS. 6A and 6B.

Figure 6A:
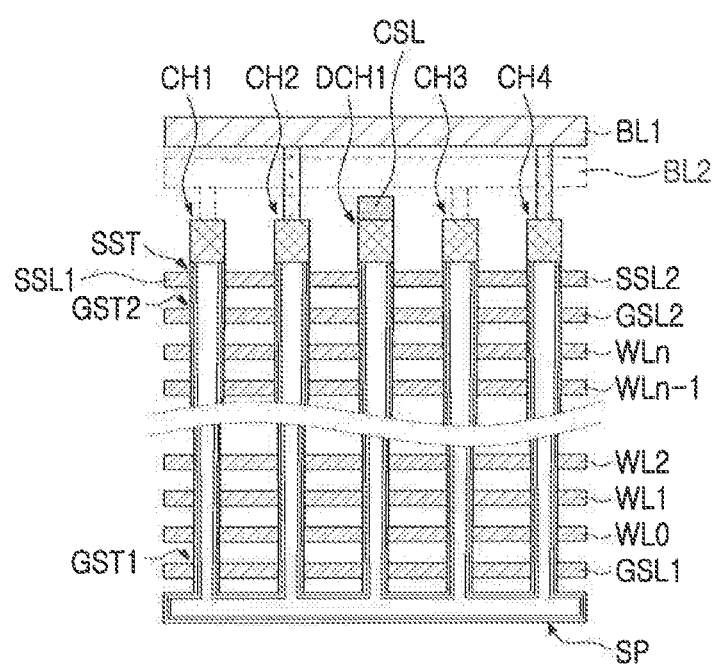

FIGS. 6A and 6B are diagrams illustrating operations of a semiconductor device according to an example embodiment.

For convenience of illustration, some elements are omitted from FIG. 6A. For example, FIG. 6A only illustrates certain elements briefly to describe the electrical connection relationship on a cross-section corresponding to FIG. 4A. FIG. 6B is a table for describing a method of biasing memory cell strings when a program operation, an erasing operation, and a reading operation are performed in a semiconductor device.

FIG. 6A illustrates first to fourth channels CH1 to CH4 and a single first dummy channel DCH1. The first and second channels CH1 and CH2 and the third and fourth channels CH3 and CH4 may share a first string select line SSL1 and a second string select line SSL2, respectively, and may be connected to different bit lines BL1 and BL2.

FIG. 6B illustrates a bias method of when a program voltage is applied in the programming of a memory cell provided by a first word line WL1 in a memory cell string of the first channel CH1. A program voltage Vpgm may be applied to the first word line WL1 (a selected word line), and a pass voltage Vpass may be applied to non-selected word lines. 0V or a ground voltage may be applied to the second bit line BL2 connected to the first channel CH1, and a power voltage Vcc may be applied to the first bit line BL1. The power voltage Vcc may be applied to the first string select line SSL1, and 0V or a ground voltage may be applied to the second string select line SSL2. 0V or a ground voltage may be applied to the first ground select line GSL1, and the power voltage Vcc may be applied to the second ground select line GSL2. An operational voltage greater than the power voltage Vcc may be applied to a common source line CSL.

In this case, the string select transistor SST may be in an off-state in the first dummy channels DCH1 under bias conditions, but as described with reference to FIGS. 5A and 5B, since the gate electrode may not completely surround the channel, the string select transistor SST may operate as in an on-state. However, the second ground select transistor GST2 in a lower portion may maintain an off-state, and thus, the channel region 140 of the first dummy channels DCH1 may maintain a boosting state. That is, when the memory cell sharing the word lines WL0 to WLn is programmed, the channel region 140 in the first dummy channels DCH1 may maintain a program inhibit state. Accordingly, a decrease in cell current, particularly a decrease in cell current of when a reading operation is performed, may be prevented, and a cell current may be secured. In example embodiments, 0V or a ground voltage may be applied to the second dummy channels DCH2, used as a body contact plug, via a wiring line. In this case, the channel region 140 may not be in a program inhibit state, and thus, an initial erase speed of an erasing operation may improve.

During an erasing operation and a reading operation, the second ground select transistor GST2 may receive the same voltage as voltages applied to the first and second string select lines SSL1 and SSL2 and the first ground select transistor GST1, or may be in the same voltage state as voltage states of the first and second string select lines SSL1 and SSL2 and the first ground select transistor GST1. During an erasing operation, an erase voltage Vers may be applied to the common source line CSL. The above described configuration may relate to the example illustrated in FIGS. 3 and 4A to 4C, in which the first and second dummy channels DCH1 and DCH2 are connected to a single source line 160 and operate. In the case in which the first and second dummy channels DCH1 and DCH2 are connected to each wiring lines separately, the erase voltage Vers may be applied to the wiring line connected to the second dummy channels DCH2.

Figure 7A:
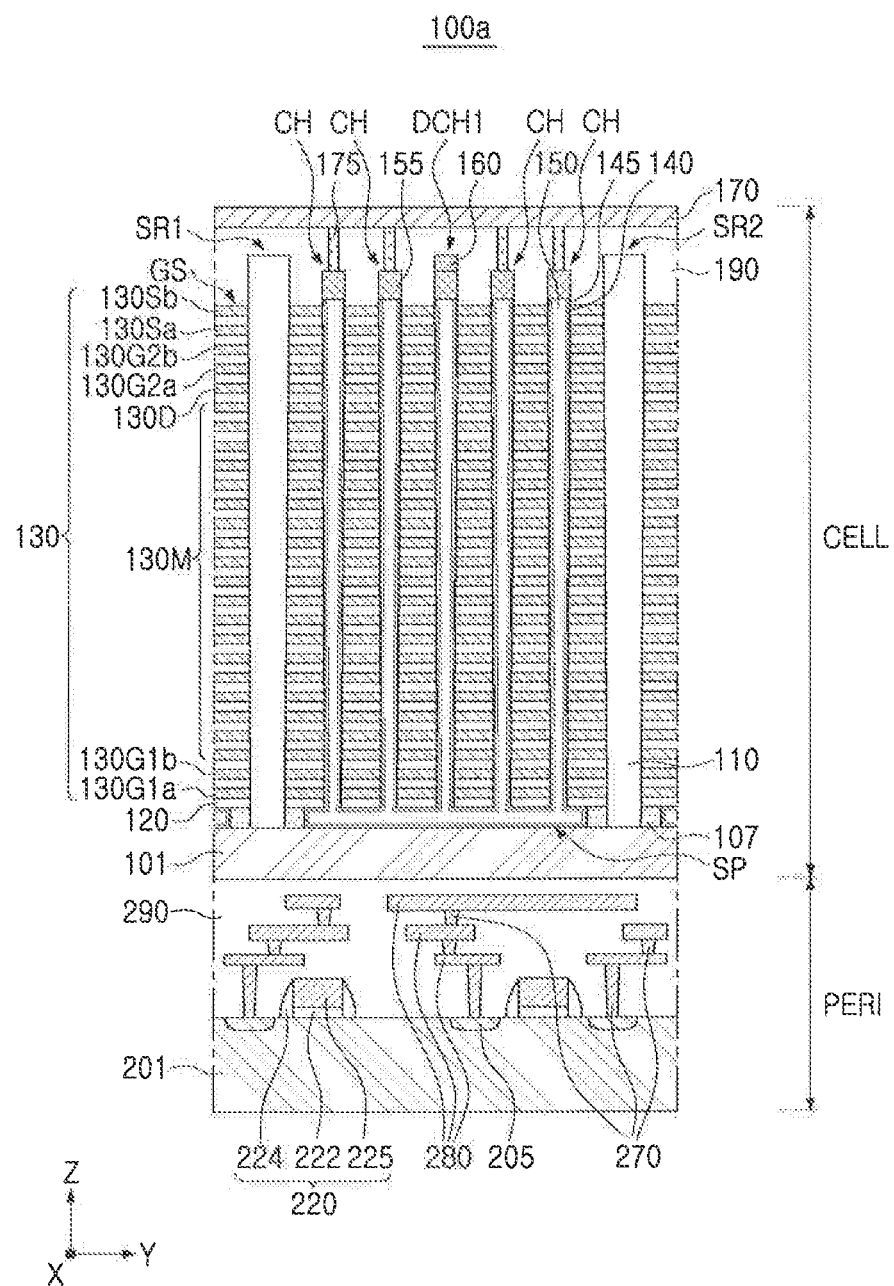
FIGS. 7A and 7B are schematic cross-sectional diagrams illustrating a semiconductor device according to an example embodiment of the present inventive concept.
Figure 7B:
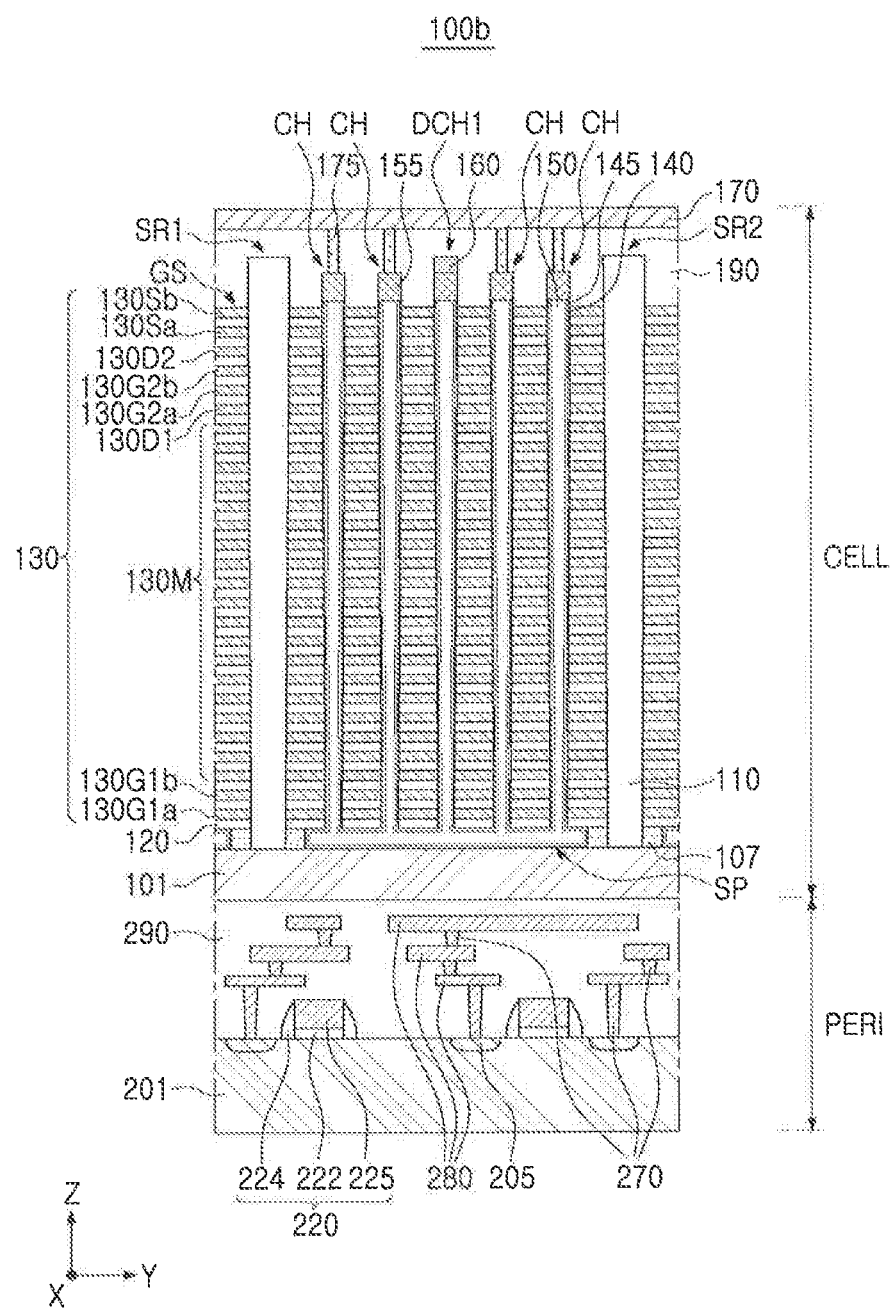

FIGS. 7A and 7B are schematic cross-sectional diagrams illustrating a semiconductor device according to an example embodiment.

Referring to FIG. 7A, gate electrodes 130 of a semiconductor device 100a may further include a dummy gate electrode 130D disposed between second ground select electrodes 130G2a and 130G2b and memory cell electrodes 130M in lower portions of the second ground select electrodes 130G2a and 130G2b. In example embodiments, the dummy gate electrodes 130D are not included in a memory cell in the semiconductor device 100a, and do not perform any particular function when memory cells operate. In example embodiments, a plurality of the dummy gate electrodes 130D may be disposed side by side upwardly and downwardly.

Referring to FIG. 7B, gate electrodes 130 of a semiconductor device 100b may further include a first dummy gate electrode 130D1 disposed between second ground select electrodes 130G2a and 130G2b and memory cell electrodes 130M in lower portions of the second ground select electrodes 130G2a and 130G2b, and may also include a second dummy gate electrode 130D2 disposed between the second ground select electrodes 130G2a and 130G2b and string select electrodes 130Sa and 130Sb in upper portions of the second ground select electrodes 130G2a and 130G2b. In this case, an upper insulating region SS (see FIG. 3) may extend to the second dummy gate electrode 130D2 from an upper portion thereof, and may divide the second dummy gate electrode 130D2, as well as the string select electrodes 130Sa and 130Sb, in a y direction. Also, ends of second and third separation regions SR2, SR3a, and SR3b (see FIG. 3) on a plane may be positioned on the second dummy gate electrode 130D2. However, example embodiments of the inventive concept are not limited thereto. As illustrated in FIGS. 7A and 7B, the dummy gate electrodes 130D, 130D1 and 130D2 may be disposed in various positions in example embodiments.

Figure 8A:
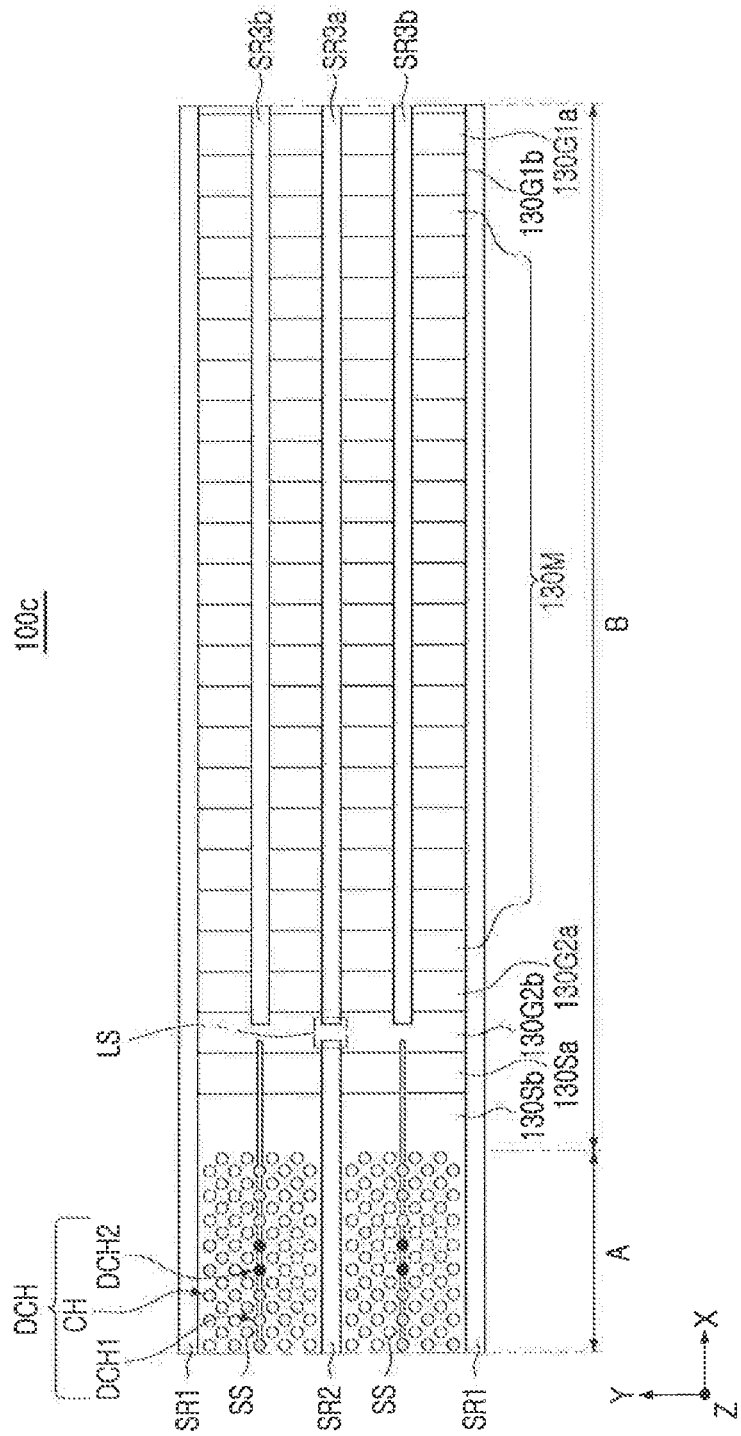
FIGS. 8A and 8B are schematic plan diagrams illustrating a semiconductor device according to an example embodiment of the present inventive concept.
Figure 8B:
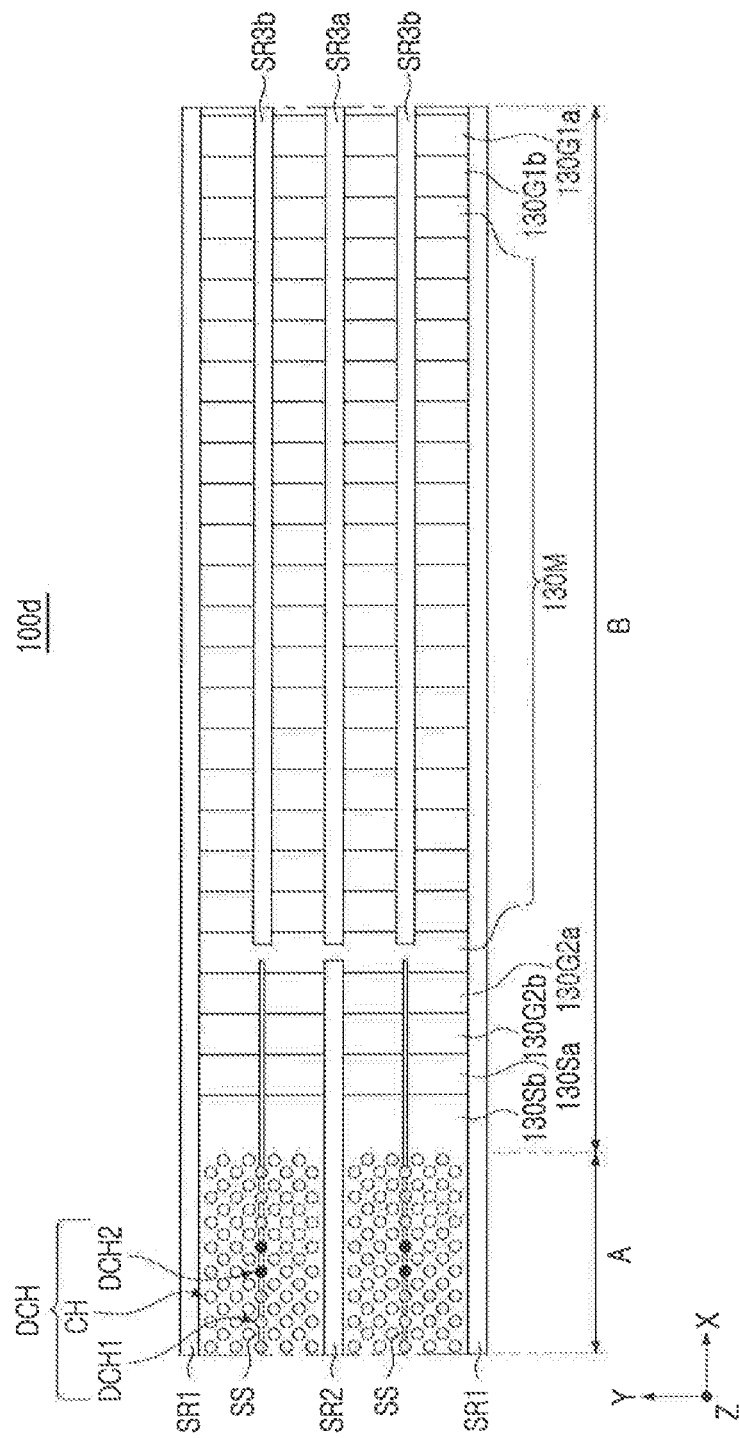

FIGS. 8A and 8B are schematic plan diagrams illustrating a semiconductor device according to an example embodiment.

Referring to FIG. 8A, a semiconductor device 100c may further include a lower insulating region LS disposed between a second separation region SR2 and a third separation region SR3a. The lower insulating region LS may include a region between the second separation region SR2 and the third separation region SR3a spaced apart from each other in the same line in an x direction.

The lower insulating region LS may completely separate one or more gate electrodes 130 in a y direction, including a lowermost gate electrode 130. For example, the lower insulating region LS may separate first ground select electrodes 130G1a and 130G1b in a y direction along with the second separation region SR2 and the third separation region SR3a. Thus, the lower insulating region LS may penetrate through the first ground select electrodes 130G1a and 130G1b. In the semiconductor device 100c, as in the circuit diagram illustrated in FIG. 2A, first ground select lines GSL1a and GSL1b may be divided into two ground select lines in lower portions of word lines WL0 to WLn.

In example embodiments, the second ground select electrodes 130G2a and 130G2b in an upper portion may also be separated from each other in a position the same as a position of the lower insulating region LS. In this case, the second ground select electrodes 130G2a and 130G2b may be disposed in a separated form similarly to the first ground select lines GSL1a and GSL1b.

Referring to FIG. 8B, in a semiconductor device 100d, a second separation region SR2 may extend to the right sides of second ground select electrodes 130G2a and 130G2b. For example, the second separation region SR2 may penetrate through the second ground select electrodes 130G2a and 130G2b and may extend to a memory cell electrode 130M or a dummy gate electrode in lower portions of the second ground select electrodes 130G2a and 130G2b. Accordingly, a position in which the second separation region SR2 and a third separation region SR3a are spaced apart from each other may be different from the example illustrated in FIG. 3.

In an example embodiment, the second ground select electrodes 130G2a and 130G2b may be isolated from each other in the y direction by the second separation region SR2. Thus, in the semiconductor device 100d, as in the circuit diagram in FIG. 2B, each of the second ground select electrodes 130G2a and 130G2b may be divided into two ground select electrodes in upper portions of word lines WL0 to WLn. In this case, each of first ground select lines GSL1a and GSL1b may be integrated with each other as a single line in lower portions of the word lines WL0 to WLn. However, example embodiments of the present inventive concept are not limited thereto.

Upper insulating regions SS may also extend to the right side on a plane similarly to the second separation region SR2. Even in this case, on a cross-section corresponding to FIG. 4B, the upper insulating regions SS may extend only up to string select electrodes 130Sa and 130Sb from upper portions. It is to be understood that the arrangement of the upper insulating regions SS on a plane is not limited to the example illustrated in FIG. 8B.

Figure 9:
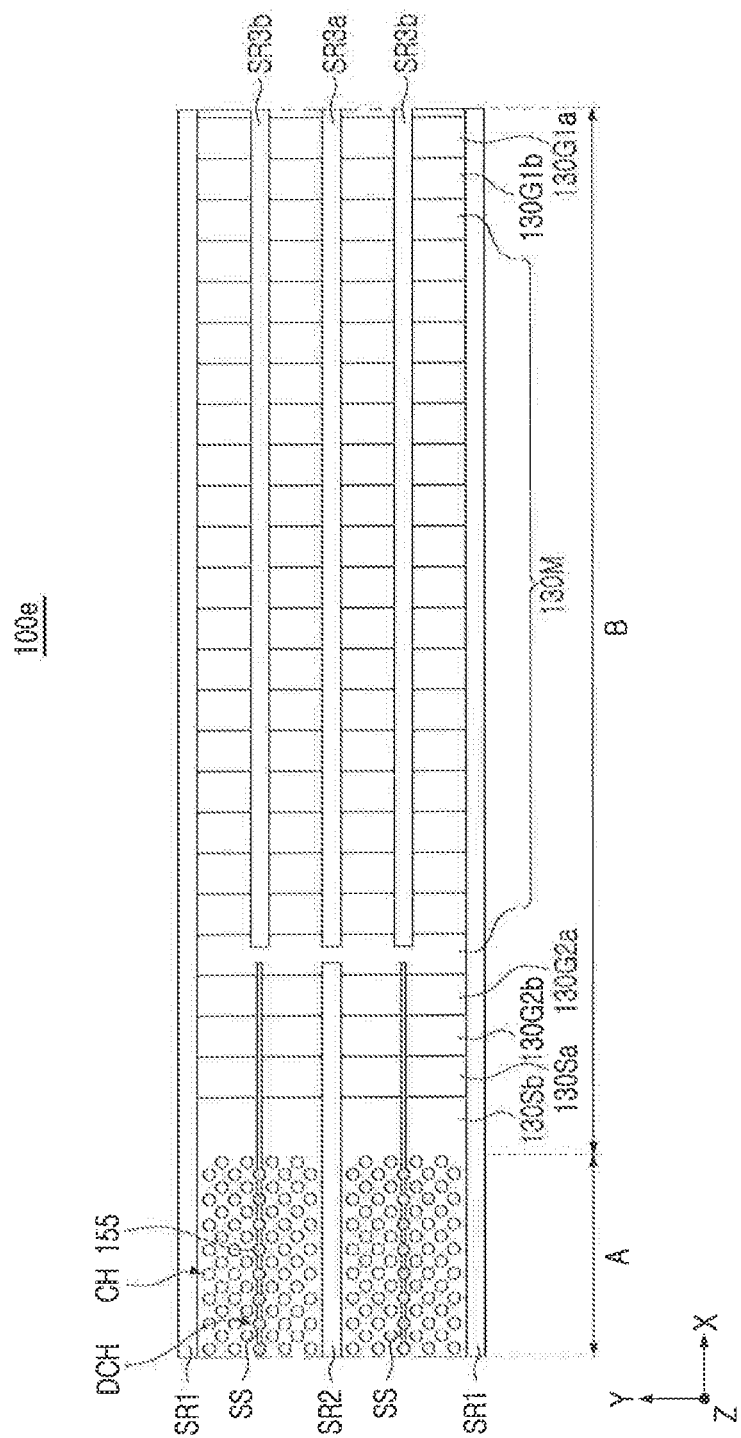
FIG. 9 is a schematic plan diagram illustrating a semiconductor device according to an example embodiment of the present inventive concept.

FIG. 9 is a schematic plan diagram illustrating a semiconductor device according to an example embodiment.

Referring to FIG. 9, in a semiconductor device 100e, only one type of dummy channels DCH may be arranged along an upper insulating region SS, unlike the example embodiment illustrated in FIG. 3. For example, the dummy channels DCH may function as a contact plug of a common source line CSL. In this case, channel pads 155 of the dummy channels DCH may include first conductivity-type impurities similar to channels CH. The first conductivity-type impurities may be, for example, n-type impurities, and may include, for example, phosphorus (P), arsenic (As), etc. In this case, memory cells of the semiconductor device 100e may be erased without receiving an erase voltage from a wiring line in an erase operation. For example, an erase operation may be performed using a gate-induced drain leakage (GIDL) phenomenon.

Figure 10:
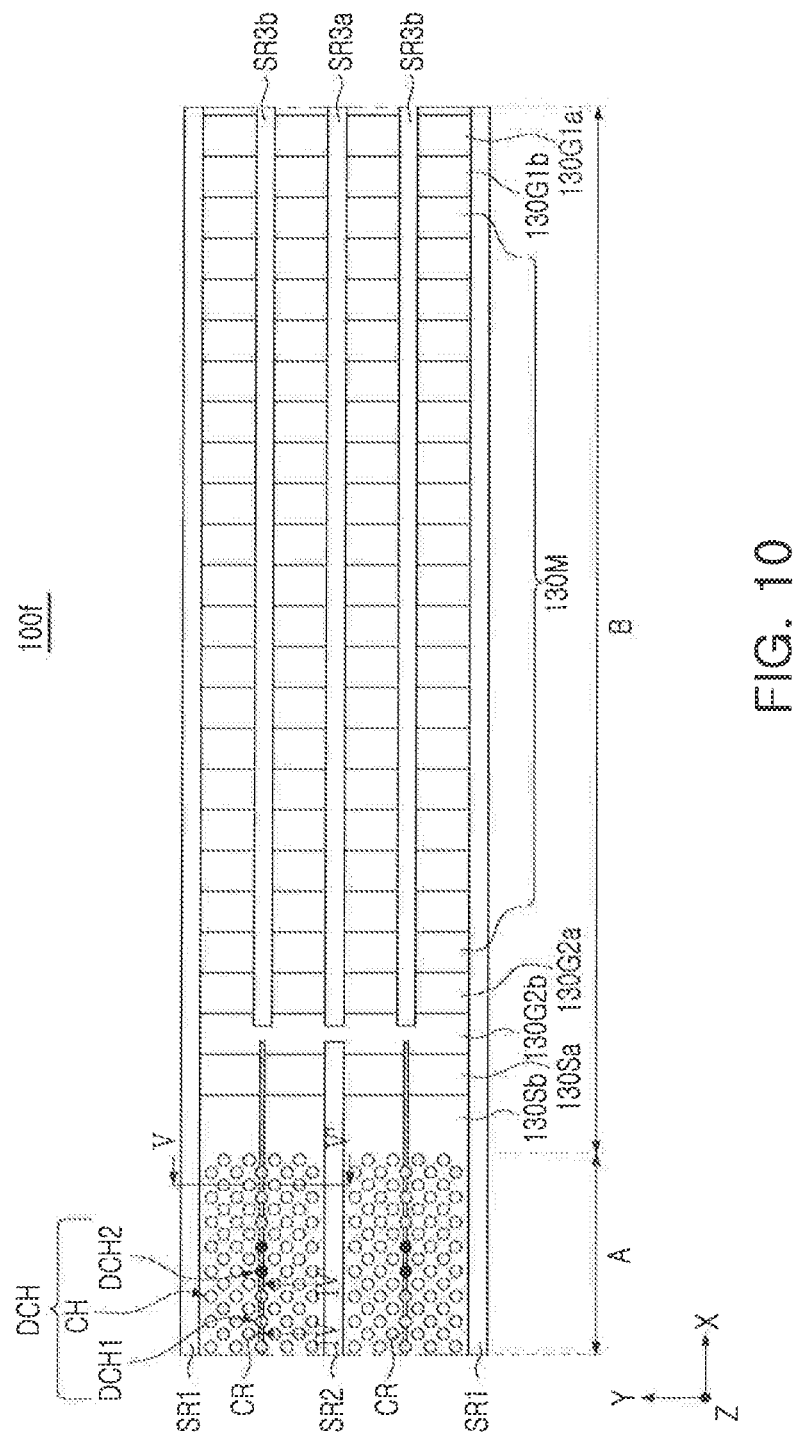
FIG. 10 is a schematic plan view diagram illustrating a semiconductor device according to an example embodiment of the present inventive concept.

FIG. 10 is a schematic plan diagram illustrating a semiconductor device according to an example embodiment.

Figure 11A:
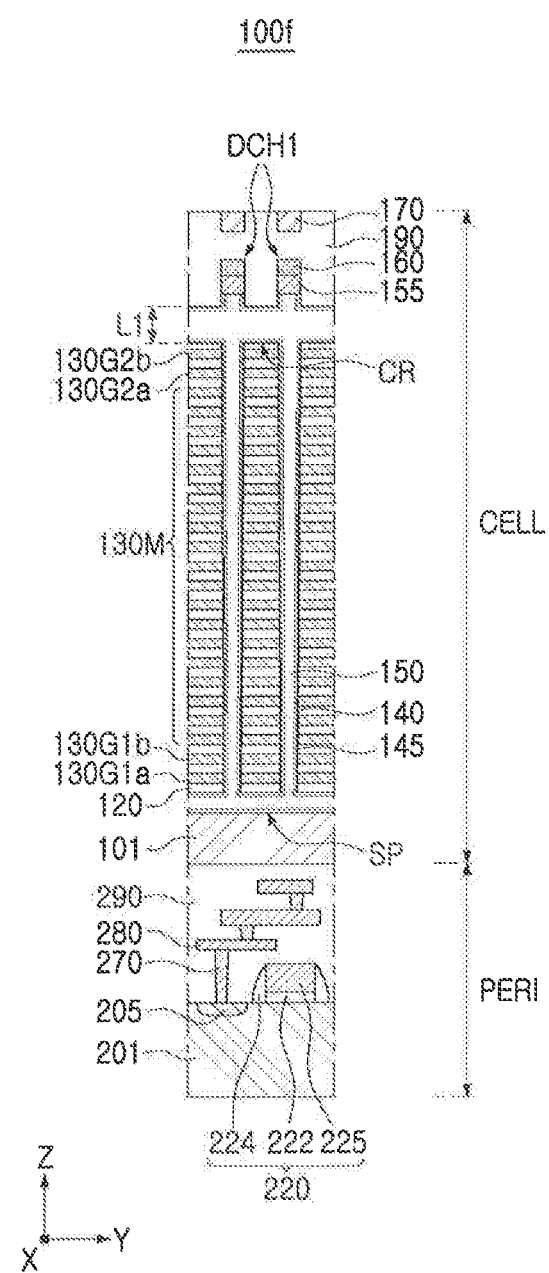
FIGS. 11A and 11B are schematic cross-sectional diagrams illustrating a semiconductor device according to an example embodiment of the present inventive concept.
Figure 11B:
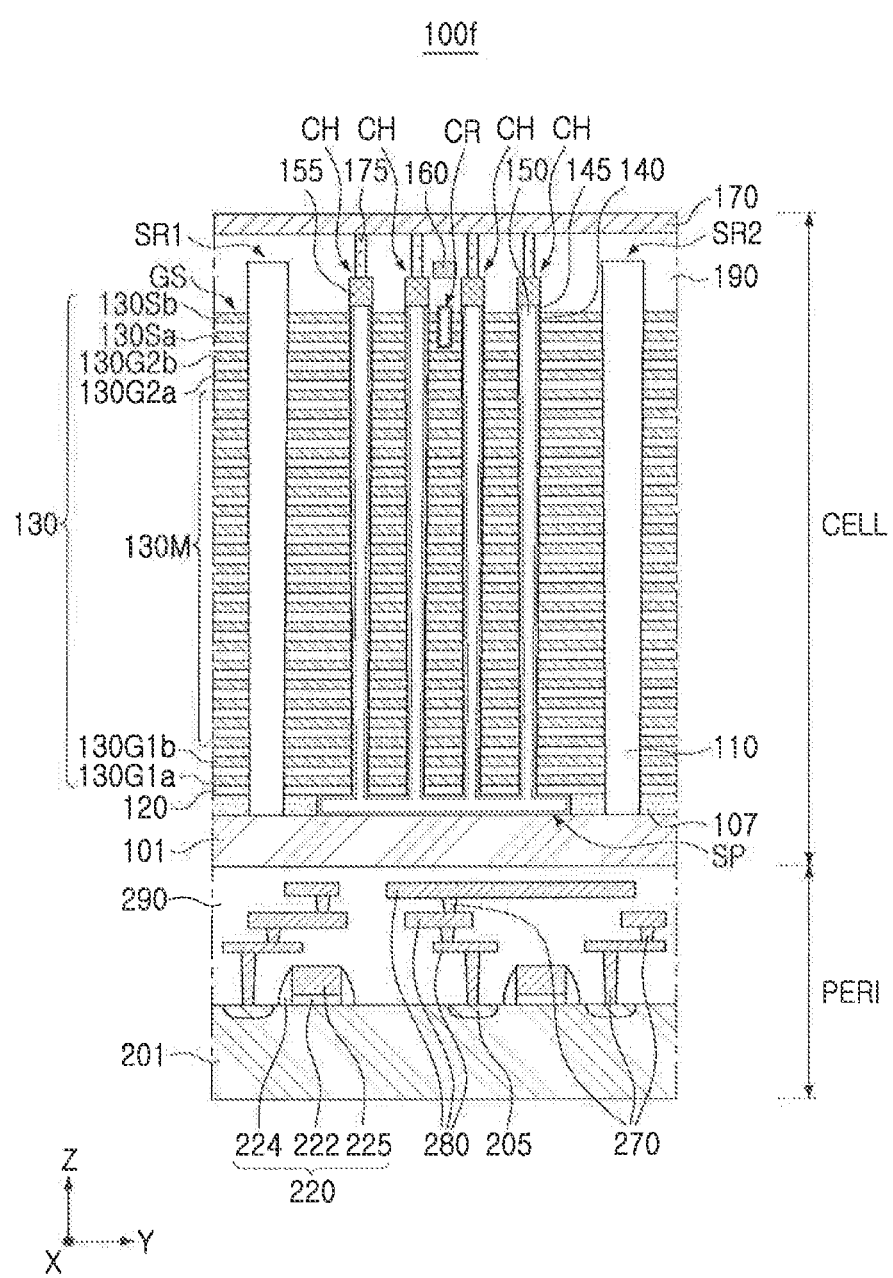

FIGS. 11A and 11B are schematic cross-sectional diagrams illustrating a semiconductor device according to an example embodiment. FIGS. 11A and 11B illustrate cross-sections taken along lines IV-IV' and V-V' of FIG. 10, respectively.

Referring to FIGS. 10 and 11A to 11B, a semiconductor device 100f may further include a channel connection portion CR connecting dummy channels DCH1 and DCH2 to each other. Thus, in the semiconductor device 100f, the channel connection portion CR may be disposed in a region in which the upper insulating regions SS is disposed, instead of the upper insulating regions SS.

The channel connection portion CR may connect adjacent dummy channels DCH1 and DCH2 to each other in a horizontal direction at the height of string select electrodes 130Sa and 130Sb. In example embodiments, the channel connection portions CR may be intermittently disposed in an x direction on a plane such that the channel connection portions CR may be disposed only between portions of the dummy channels DCH1 and DCH2.

A gate dielectric layer 145, a channel region 140, and a channel insulating layer 150 extending from the dummy channels DCH1 and DCH2 may be disposed in the channel connection portion CR. However, in example embodiments, a portion of the layers may be omitted depending on a length L1 of the channel connection portion CR taken in a z direction. For example, the channel connection portion CR may be filled with the gate dielectric layer 145 and the channel region 140. A lower surface of the channel connection portion CR may be disposed within an interlayer insulating layer 120, and an upper surface may be disposed within a cell region insulating layer 190. The length L1 of the channel connection portion CR and positions of upper and lower surfaces of the channel connection portion CR may vary in example embodiments. For example, in example embodiments, a lower surface of the channel connection portion CR may be connected to a horizontal portion SP.

When the semiconductor device 100f operates, a carrier may move along the channel region 140 in the channel connection portion CR. Thus, when an electrical signal is applied to one of the dummy channels DCH1 and DCH2 connected to each other by the channel connection portion CR, a carrier may also move to the channel regions 140 of the dummy channels DCH1 and DCH2 to which an electrical signal is not applied, through the channel connection portion CR. The channel connection portion CR may also be applied to other example embodiments, including the semiconductor device 100e illustrated in FIG. 9.

Figure 12:
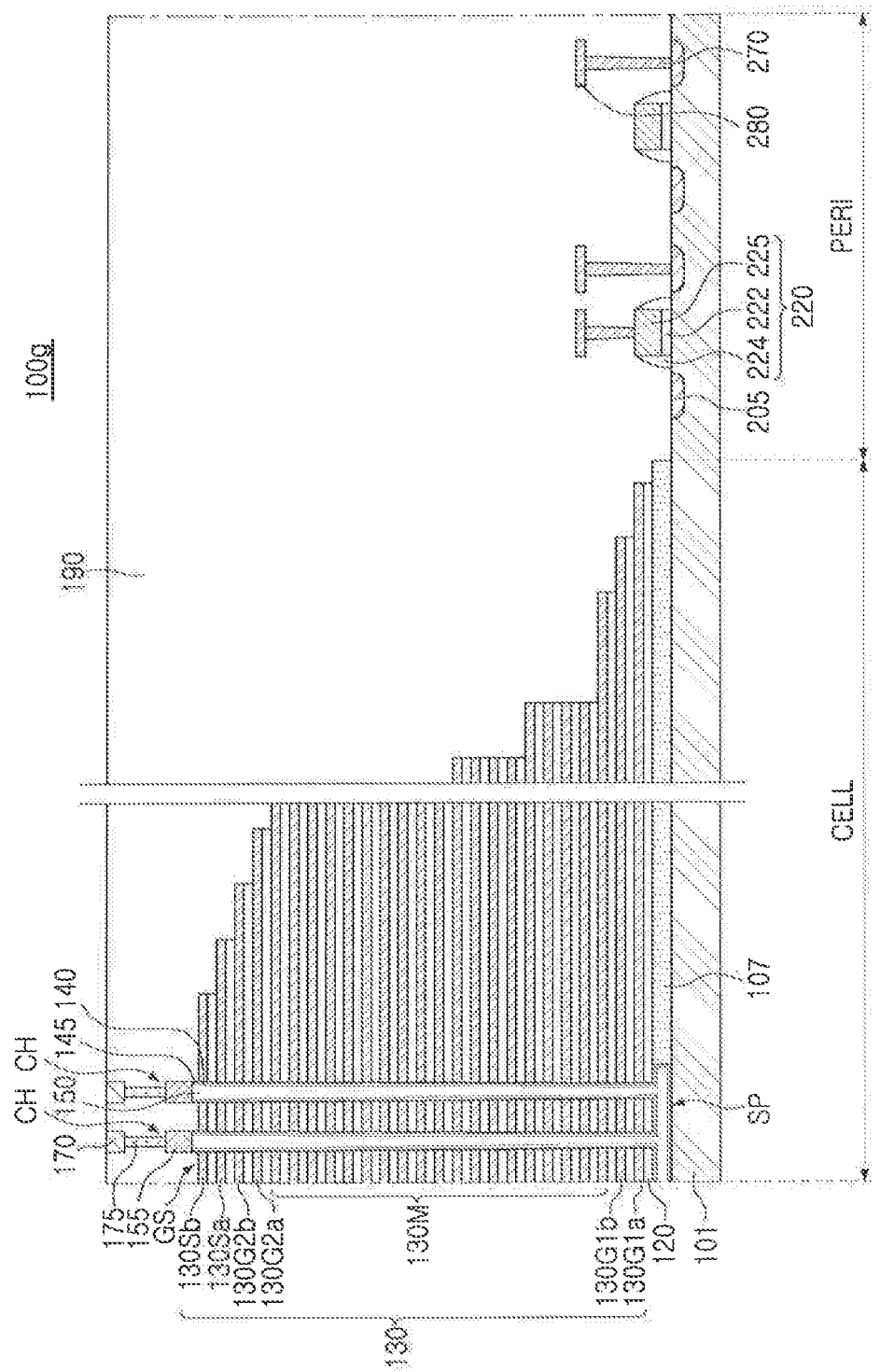
FIG. 12 is a schematic cross-sectional diagram illustrating a semiconductor device according to an example embodiment of the present inventive concept.

FIG. 12 is a schematic cross-sectional diagram illustrating a semiconductor device according to an example embodiment.

Referring to FIG. 12, a semiconductor device 100g may include a memory cell region CELL and a peripheral circuit region PERI. In the semiconductor device 100g, the peripheral circuit region PERI may be disposed on at least one side of the memory cell region CELL. The description of the memory cell region CELL may be the same as the description of the memory cell region CELL described above with reference to FIGS. 3 and 4A to 4C.

The peripheral circuit region PERI may include circuit devices 220 disposed on the same substrate 101 on which the memory cell region CELL is disposed, source/drain regions 205 disposed in the substrate 101, circuit contact plugs 270, and circuit wiring lines 280. A cell region insulating layer 190 or another insulating layer may be disposed in upper portions of the circuit devices 220. The circuit devices 220 may also be referred to as peripheral circuits.

In the gate electrodes 130 in the memory cell region CELL, first ground select electrodes 130G1a and 130G1b, memory cell electrodes 130M, second ground select electrodes 130G2a and 130G2b, and string select electrodes 130Sa and 130Sb may be independently controlled by the circuit devices 220 disposed in the peripheral circuit region PERI. For example, in an example embodiment, the first ground select electrodes 130G1a and 130G1b, the second ground select electrodes 130G2a and 130G2b, and the string select electrodes 130Sa and 130Sb are electrically connected to different circuit devices 220, respectively.

Figure 13:
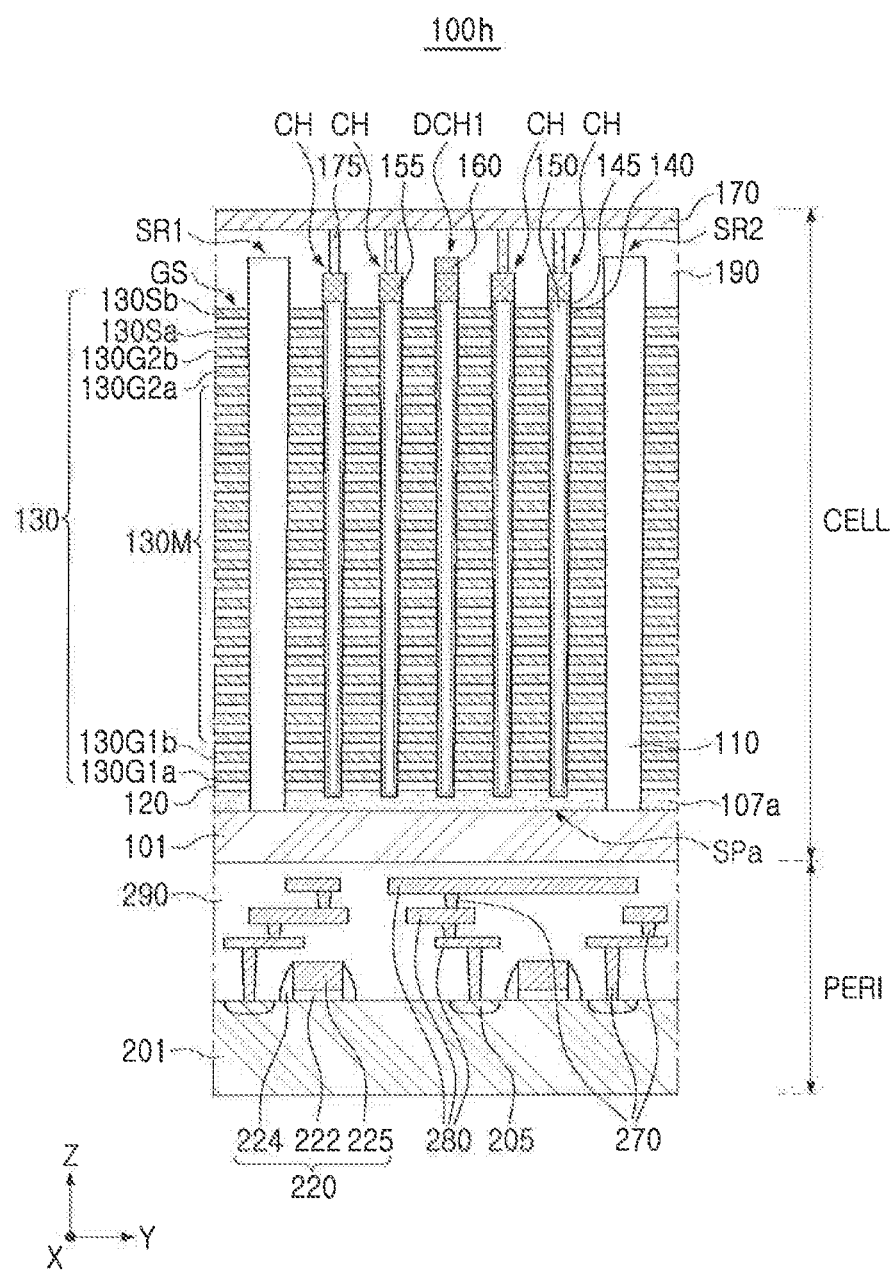
FIG. 13 is a schematic cross-sectional diagram illustrating a semiconductor device according to an example embodiment of the present inventive concept.

FIG. 13 is a schematic cross-sectional diagram illustrating a semiconductor device according to an example embodiment.

Referring to FIG. 13, in a semiconductor device 100h, a horizontal portion Spa may be configured as a horizontal conductive layer 107a, unlike the example embodiments illustrated in FIGS. 4A to 4C.

The horizontal conductive layer 107a may include a conductive material such as, for example, a metal material such as tungsten (W), and/or a semiconductor material such as, for example, doped polycrystalline silicon. The horizontal conductive layer 107a may be connected to lower ends of channels CH and dummy channels DCH1 and DCH2, and may be disposed in parallel to an upper surface of a substrate 101 such that the horizontal conductive layer 107a may have a connected structure between at least portions of the channels CH and the dummy channels DCH1 and DCH2. The channels CH and the dummy channels DCH1 and DCH2 may be formed subsequently after the horizontal conductive layer 107a is formed, and lower ends of the channels CH and the dummy channels DCH1 and DCH2 may be recessed into the horizontal conductive layer 107a, or may be in contact with the horizontal conductive layer 107a. A portion of the gate dielectric layer 145 may be removed on lower ends of the channels CH and the dummy channels DCH1 and DCH2, and the channel region 140 may be connected to the horizontal conductive layer 107a.

In example embodiments, at least a portion of the horizontal portion Spa may be disposed within the substrate 101, and the horizontal conductive layer 107a may constitute an upper region of the substrate 101.

FIGS. 14A to 14I are schematic cross-sectional diagrams illustrating a method of manufacturing a semiconductor device according to an example embodiment. FIGS. 14A to 14I illustrate regions corresponding to a region illustrated in FIG. 4A.

Figure 14A:
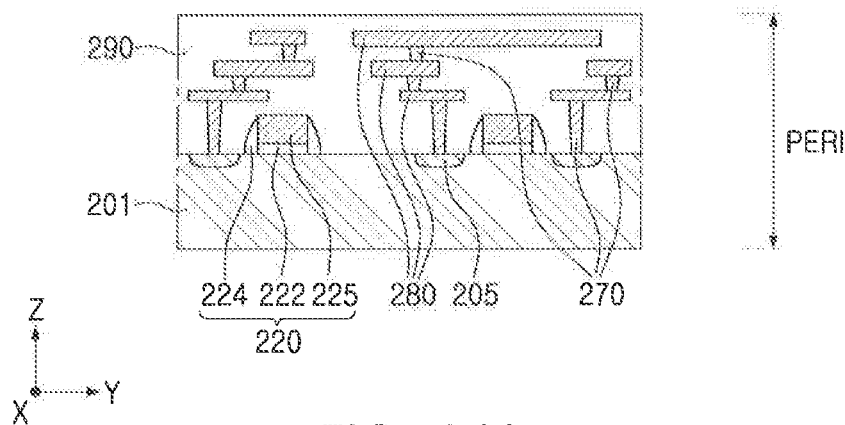
FIGS. 14A to 14I are schematic cross-sectional diagrams illustrating a method of manufacturing a semiconductor device according to an example embodiment of the present inventive concept.

Referring to FIG. 14A, a peripheral circuit region PERI including circuit devices 220, and lower wiring structures may be formed on a base substrate 201.

A circuit gate dielectric layer 222 and a circuit gate electrode 225 may be formed in order on the base substrate 201. The circuit gate dielectric layer 222 and the circuit gate electrode 225 may be formed using, for example, an atomic layer deposition (ALD) process or a chemical vapor deposition (CVD) process. The circuit gate dielectric layer 222 may be formed of silicon oxide, and the circuit gate electrode 225 may be formed of at least one of polycrystalline silicon or a metal silicide layer. However, example embodiments of the inventive concept are not limited thereto. A spacer layer 224 and source/drain regions 205 may be formed on both side walls of the circuit gate dielectric layer 222 and the circuit gate electrode 225. In example embodiments, the spacer layer 224 may be configured as a plurality of layers. The source/drain regions 205 may be formed, for example, by performing an ion implantation process.

The circuit contact plugs 270 among the lower wiring structures may be formed by, after partially forming a peripheral region insulating layer 290, partially etching the peripheral region insulating layer 290 and filling a conductive material. The lower wiring lines 280 may be formed by depositing and patterning a conductive material.

The peripheral region insulating layer 290 may include a plurality of insulating layers. The peripheral region insulating layer 290 may be partially formed in stages of forming the lower wiring structures, and may be partially formed in an upper portion of a lower wiring line 280 in an uppermost portion such that the peripheral region insulating layer 290 may cover the circuit devices 220 and the lower wiring structures.

Figure 14B:
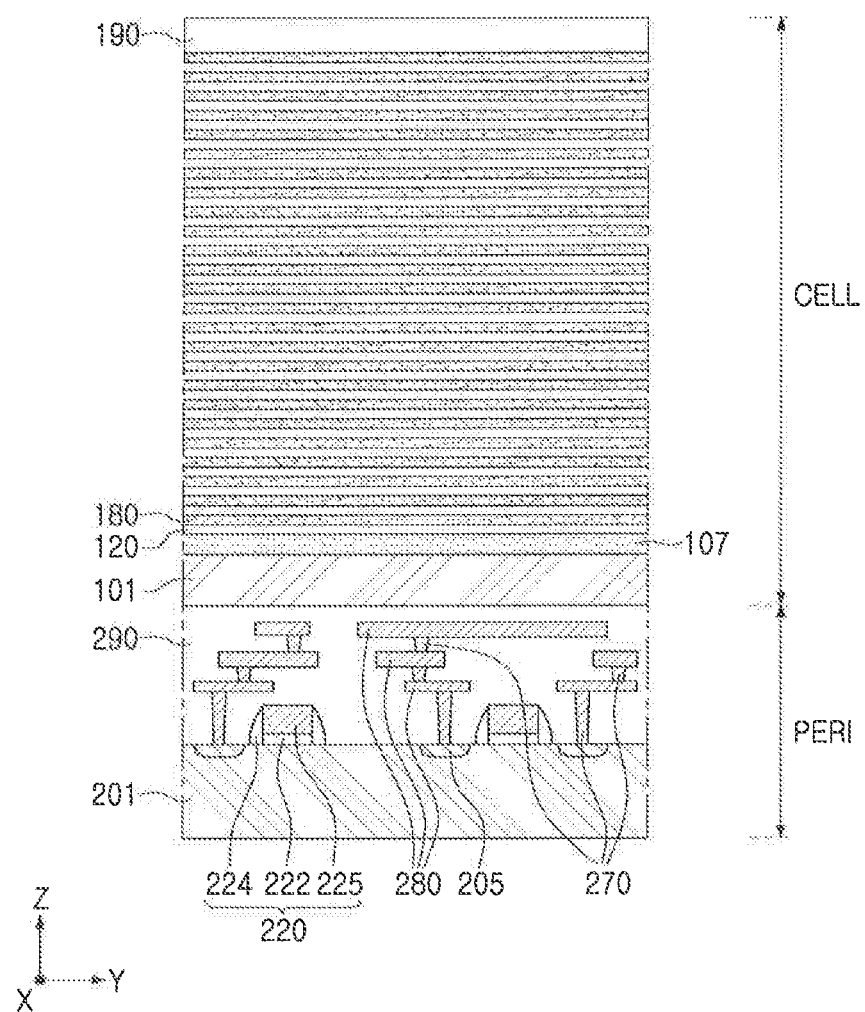

Referring to FIG. 14B, to form a memory cell region CELL on a peripheral circuit region PERI, a substrate 101 may be formed, a horizontal filling layer 107 may be formed on the substrate 101, sacrificial layers 180 and interlayer insulating layers 120 may be alternately stacked, and a cell region insulating layer 190 may be formed.

A portion of the horizontal filling layer 107 may be replaced with the horizontal portion SP illustrated in FIG. 4A through a subsequent process, and the sacrificial layers 180 may be layers replaced with gate electrodes 130. The horizontal filling layer 107 and the sacrificial layers 180 may be formed of a material different from a material of the interlayer insulating layers 120, and may be formed of a material having etch selectivity and etched under certain etching conditions in relation to the interlayer insulating layers 120. For example, the interlayer insulating layers 120 may be formed of at least one of silicon oxide and silicon nitride, and the horizontal filling layer 107 and the sacrificial layers 180 may be formed of a material different from a material of the interlayer insulating layers 120 selected from among silicon, silicon oxide, silicon carbide, and silicon nitride. The horizontal filling layer 107 may be formed of a material having etch selectivity and etchable for the sacrificial layers 180. For example, the horizontal filling layer 107 may be polycrystalline silicon, and the sacrificial layers 180 may be silicon nitride.

In example embodiments, thicknesses of the interlayer insulating layers 120 are not the same. For example, the interlayer insulating layers 120 in a lowermost portion may have a relatively small thickness, and the interlayer insulating layers 120 in an uppermost portion may have a relatively large thickness. Thicknesses and the number of films of the interlayer insulating layers 120 and the sacrificial layers 180 may vary, and thus, may be different from the example illustrated in FIG. 14B.

The cell region insulating layer 190 may cover an upper surface of a stack structure of the sacrificial layers 180 and the interlayer insulating layers 120.

Figure 14C:
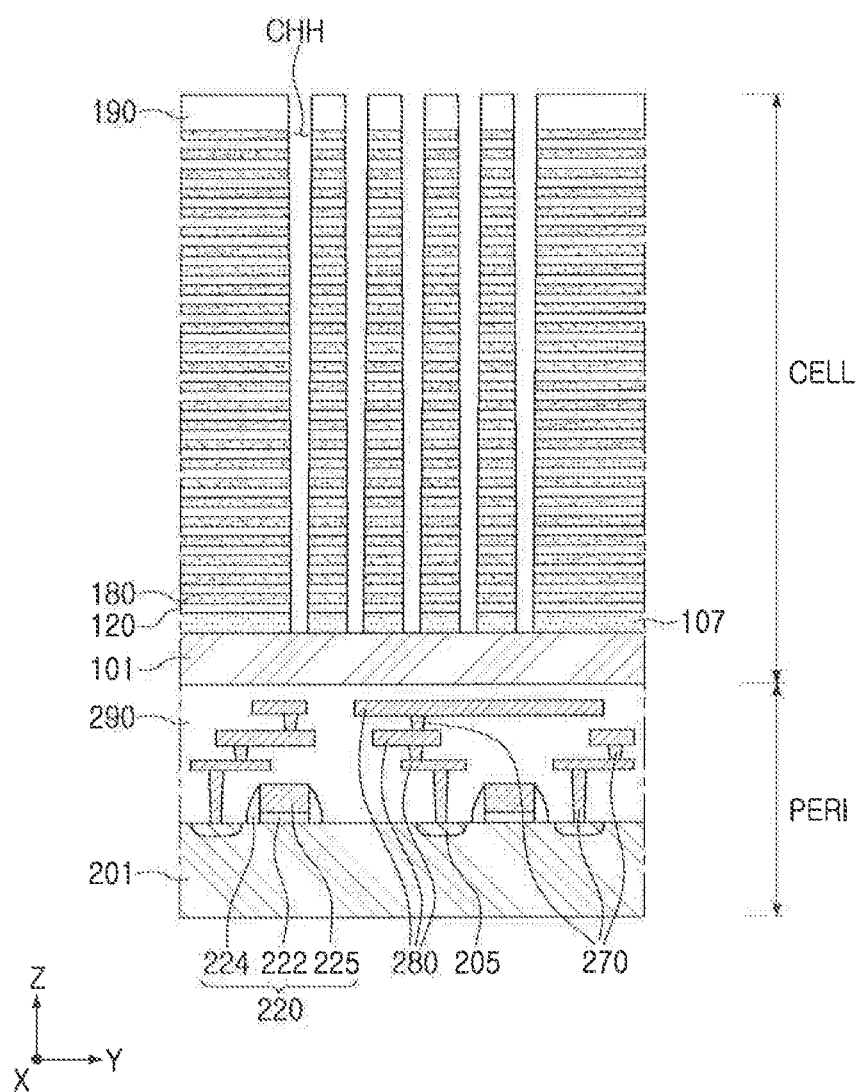

Referring to FIG. 14C, channel holes CHH penetrating a stack structure of a horizontal filling layer 107, sacrificial layers 180, and interlayer insulating layers 120 may be formed.

An upper separation insulating layer 103 (see FIG. 4B) included in upper insulating regions SS may be formed by partially removing the sacrificial layers 180 and the interlayer insulating layers 120 in a region not illustrated. The upper insulating regions SS may be formed by exposing a region in which the upper insulating regions SS is formed using a mask layer, removing a certain number of the sacrificial layers 180 and the interlayer insulating layers 120 from an uppermost portion, and depositing an insulating material. A string separation region SS may extend into the interlayer insulating layer 120 disposed in lower portions of the string select electrodes 130Sa and 130Sb illustrated in FIG. 4A. A material of the upper separation insulating layer 103 may be different from a material of the sacrificial layers 180. For example, a material of the upper separation insulating layer 103 may be the same as a material of the interlayer insulating layer 120. In the example embodiments described with reference to FIGS. 10 and 11A to 11B, the upper separation insulating layer 103 may be formed, for example, of a material different from materials of the interlayer insulating layers 120 and the sacrificial layers 180 or a material the same as a material of the horizontal filling layer 107, and the upper separation insulating layer 103 may be removed when the horizontal filling layer 107 is partially removed in a subsequent process.

The channel holes CHH may be formed by anisotropically etching the horizontal filling layer 107, the sacrificial layers 180, and the interlayer insulating layers 120 in a region in which channels CH and dummy channels DCH1 and DCH2 are formed, and may be formed in the form of holes. Due to a height of the stack structure, in example embodiments, side walls of the channel holes CHH are not perpendicular to an upper surface of the substrate 101. In example embodiments, the channel holes CHH may allow a portion of the substrate 101 to be recessed. In example embodiments, the channel holes CHH may only extend up to an upper surface of the horizontal filling layer 107 or an internal region of the horizontal filling layer 107 such that the horizontal filling layer 107 may be exposed on lower ends.

Figure 14D:
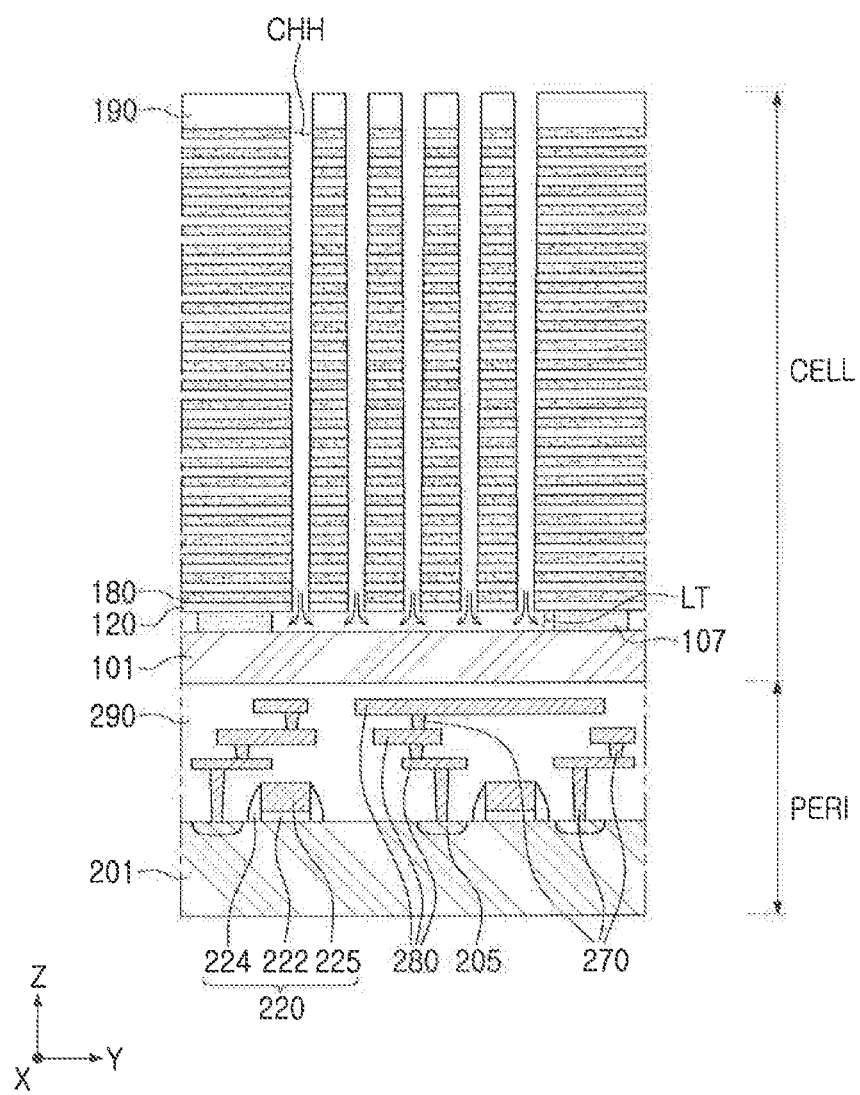

Referring to FIG. 14D, a horizontal tunnel portion LT may be formed by partially removing the horizontal filling layer 107 through the channel holes CHH.

The horizontal filling layer 107 may be removed by a dry etching process such as, for example, a gas phase etching (GPE) process, and may be selectively removed while allowing the interlayer insulating layers 120 and the sacrificial layers 180 to remain. Also, by controlling process conditions such as a process time, only a portion of the horizontal filling layer 107 may be removed in a horizontal direction from the channel holes CHH. After the horizontal tunnel portion LT is formed, the stack structure of the interlayer insulating layers 120 and the sacrificial layers 180 in an upper portion may be supported by the remaining horizontal filling layer 107.

In example embodiments, the horizontal filling layer 107 may include a plurality of layers disposed horizontally, and one of the layers may be removed in this stage, thereby forming the horizontal tunnel portion LT.

Figure 14E:
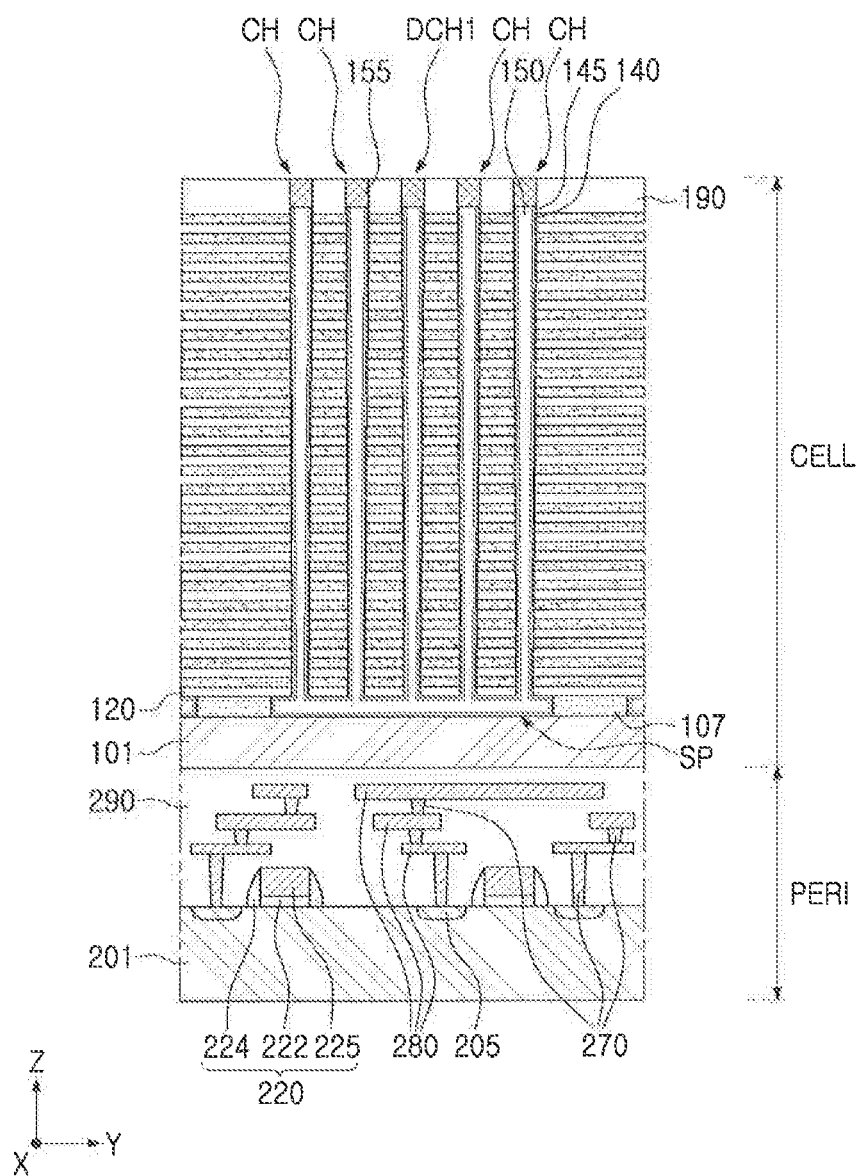

Referring to FIG. 14E, at least a portion of a gate dielectric layer 145, a channel region 140, a channel insulating layer 150, and channel pads 155 may be formed in order in channel holes CHH and a horizontal tunnel portion LT, and impurities may be implanted into the channel pads 155, thereby forming channels CH, dummy channels DCH1 and DCH2, and a horizontal portion SP.

The gate dielectric layer 145 may be configured to have a uniform thickness through, for example, an ALD process or a CVD process. The overall gate dielectric layer 145 or a portion of the gate dielectric layer 145 may be formed in this stage, and a portion of the gate dielectric layer 145 extending perpendicularly to the substrate 101 along the channel holes CHH may be formed in this stage. The channel region 140 may be formed on the gate dielectric layer 145 in the channel holes CHH. The channel insulating layer 150 may fill the channel holes CHH, and may be formed of an insulating material. In example embodiments, a space between the channel regions 140 may be filled with a conductive material rather than the channel insulating layer 150. The channel pad 155 may be formed of a conductive material. For example, the channel pad 155 may be formed of polycrystalline silicon.

The gate dielectric layer 145, the channel region 140, and the channel insulating layer 150 may extend to the horizontal tunnel portion LT in lower ends of the channel holes CHH, and may be stacked in order on side walls, an upper surface and a lower surface of the horizontal tunnel portion LT.

Impurities may be implanted into the channel pads 155. Using a mask layer, different types of conductive impurities may be implanted into the channels CH, the first dummy channels DCH1, and the second dummy channels DCH2. In example embodiments, impurities may also be implanted when the channel pads 155 are formed without additionally performing an ion implantation process.

Figure 14F:
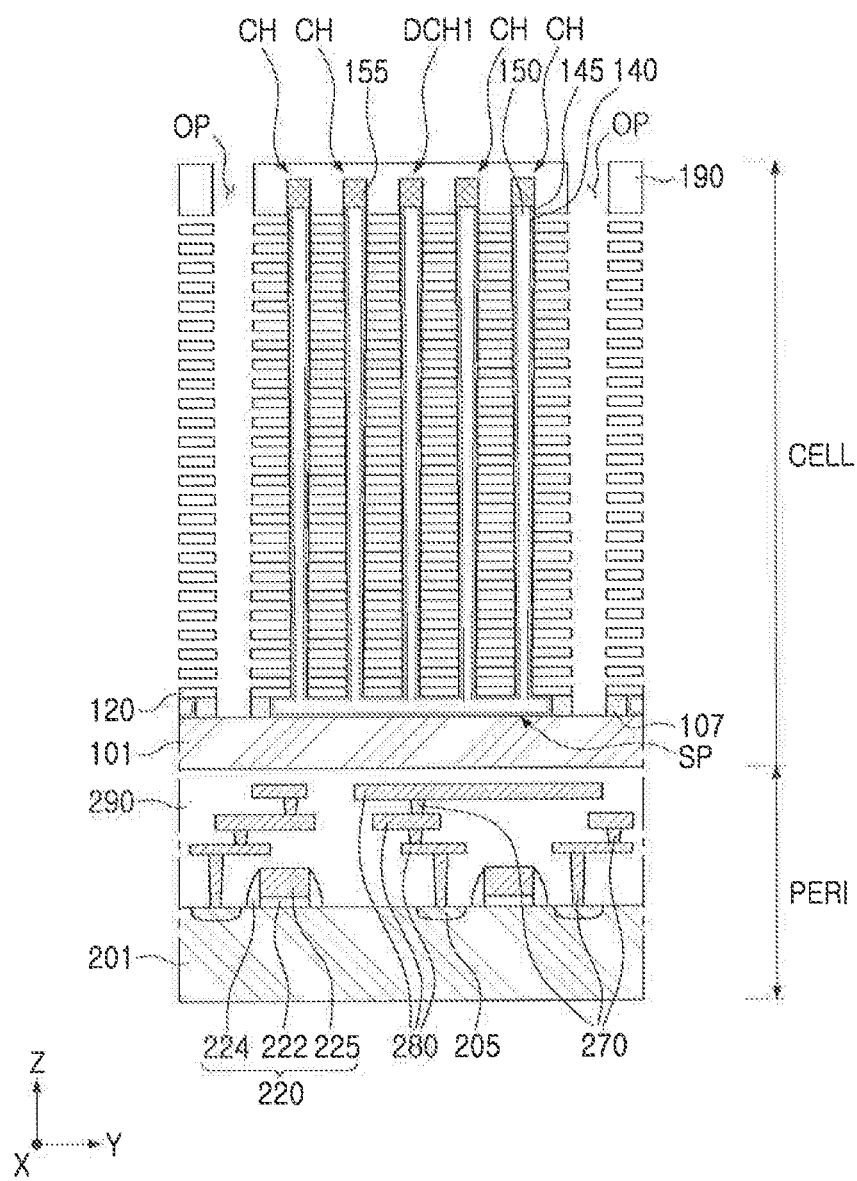

Referring to FIG. 14F, openings OP penetrating a stack structure of a horizontal filling layer 107, sacrificial layers 180, and interlayer insulating layers 120 may be formed, and the sacrificial layers 180 may be removed through the openings OP.

Before forming the openings OP, an insulating material forming a cell region insulating layer 190 may be additionally deposited on channels CH and dummy channels DCH1 and DCH2.

The openings OP may be formed in positions of the first to third separation regions SR1, SR2, SR3*a*, and SR3*b* illustrated in FIG. 3. The openings OP may be formed by forming a mask layer using a photolithography process and anisotropically etching the stack structure. The openings OP may be formed in a form of a trench extending in an x direction, and the substrate 101 may be exposed in lower portions of the openings OP. In example embodiments, the openings OP may extend only up to an upper surface of the horizontal filling layer 107, and accordingly, the horizontal filling layer 107 may be exposed in lower portions of the openings OP.

The sacrificial layers 180 may be selectively removed in relation to the horizontal filling layer 107 and the interlayer insulating layers 120 using, for example, a wet etching process. Accordingly, a plurality of tunnel portions may be formed between the interlayer insulating layers 120, and portions of side walls of the channels CH and the dummy channels DCH1 and DCH2 may be exposed through the tunnel portions.

Figure 14G:
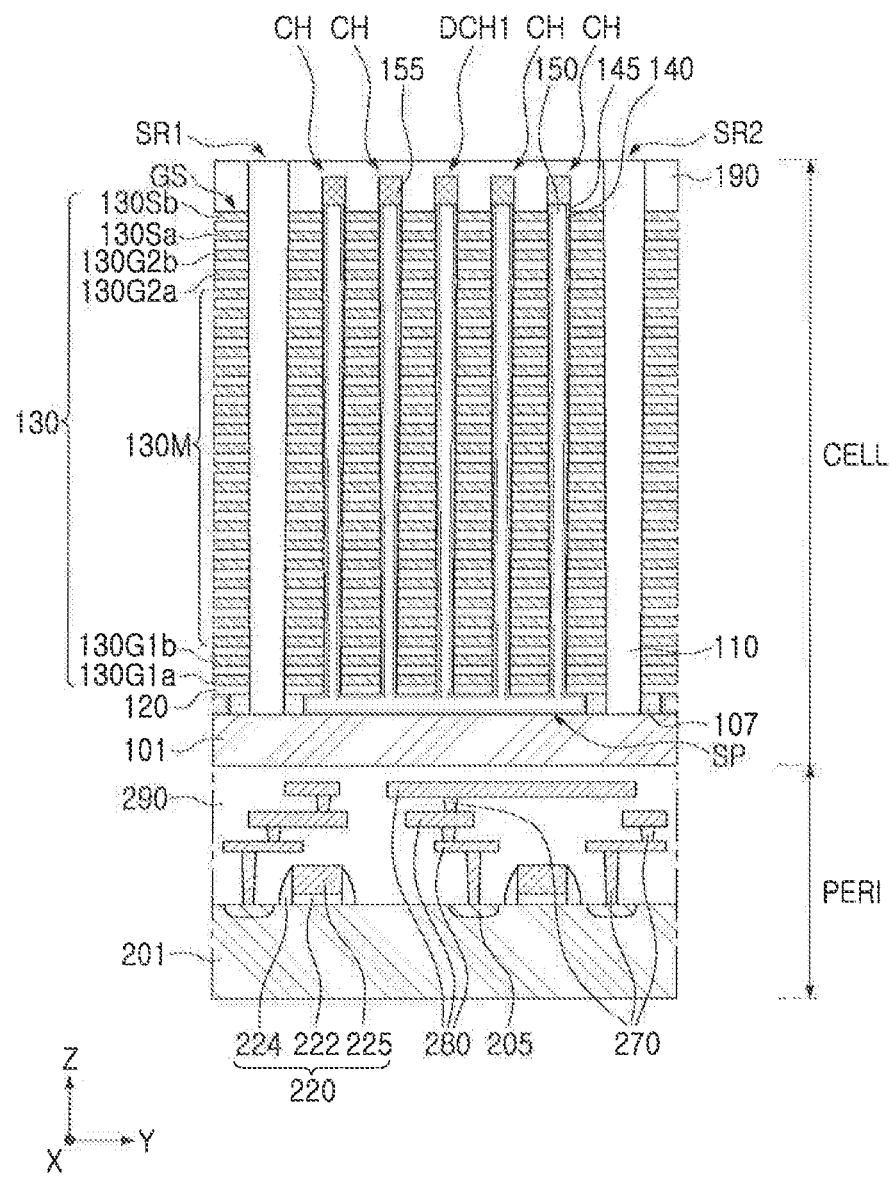

Referring to FIG. 14G, the gate electrodes 130 may be formed by filling the tunnel portions from which the sacrificial layers 180 are removed with a conductive material, and a separation insulating layer 110 may be formed in the openings OP.

The conductive material may be filled in regions from which the sacrificial layers 180 are removed. The conductive material may include, for example, a metal, polycrystalline silicon, or a metal silicide material. After forming the gate electrodes 130, the conductive material deposited in the openings OP may be removed through an additional process.

The separation insulating layer 110 may be formed to fill the openings OP. The separation insulating layer 110 may be formed in regions corresponding to the first to third separation regions SR1, SR2, SR3*a*, and SR3*b* illustrated in FIG. 3.

Figure 14H:
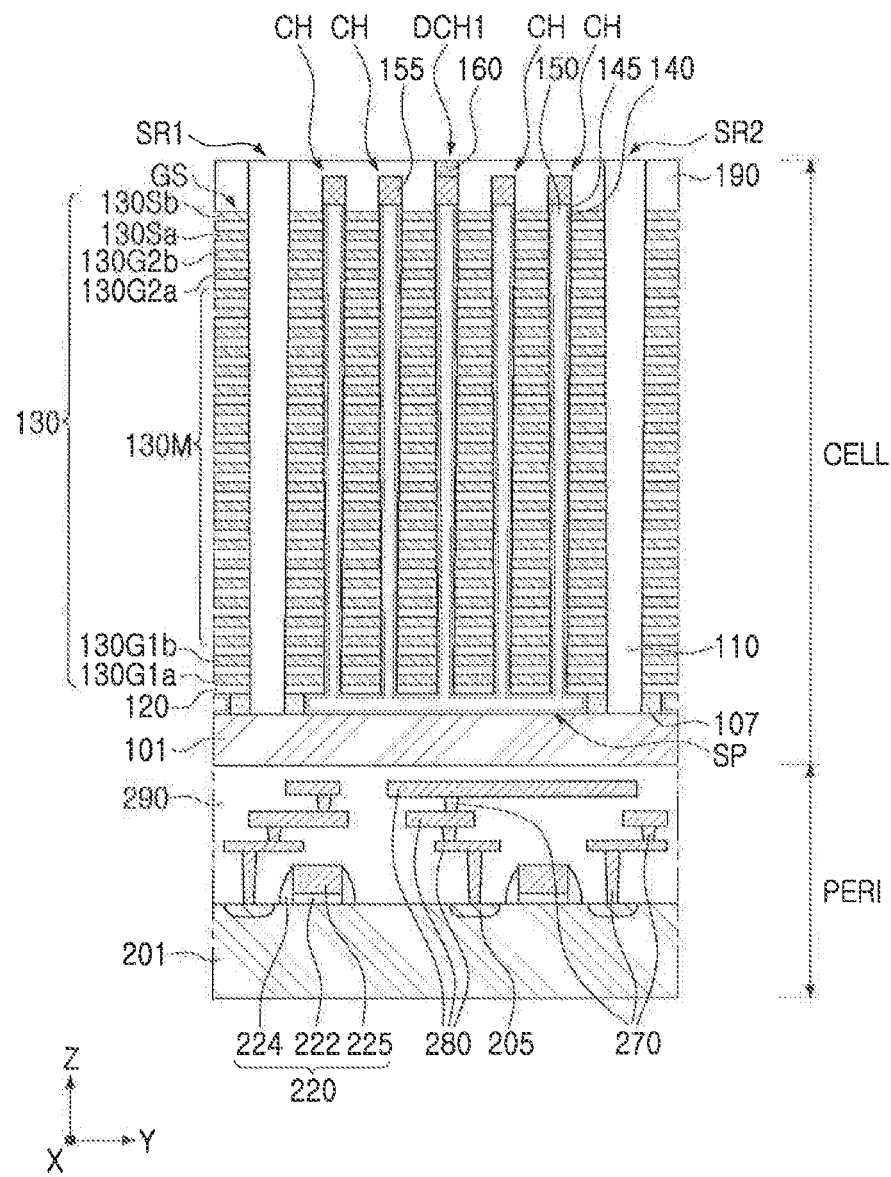

Referring to FIG. 14H, a wiring line including a source line 160 may be formed on dummy channels DCH1 and DCH2.

The source line 160 may be formed by, after patterning a cell region insulating layer 190 to expose channel pads 155 of the dummy channels DCH1 and DCH2, depositing a conductive material. Alternatively, the source line 160 may be formed by depositing a conductive material on the channel pads 155 and patterning the conductive material. In example embodiments, the source line 160 may be connected to both dummy channels DCH1 and DCH2, or may only be connected to the first dummy channels DCH1. In this case, another wiring line may be formed on the second dummy channels DCH2. In example embodiments, the source line 160 is connected to all dummy channels DCH.

Figure 14I:
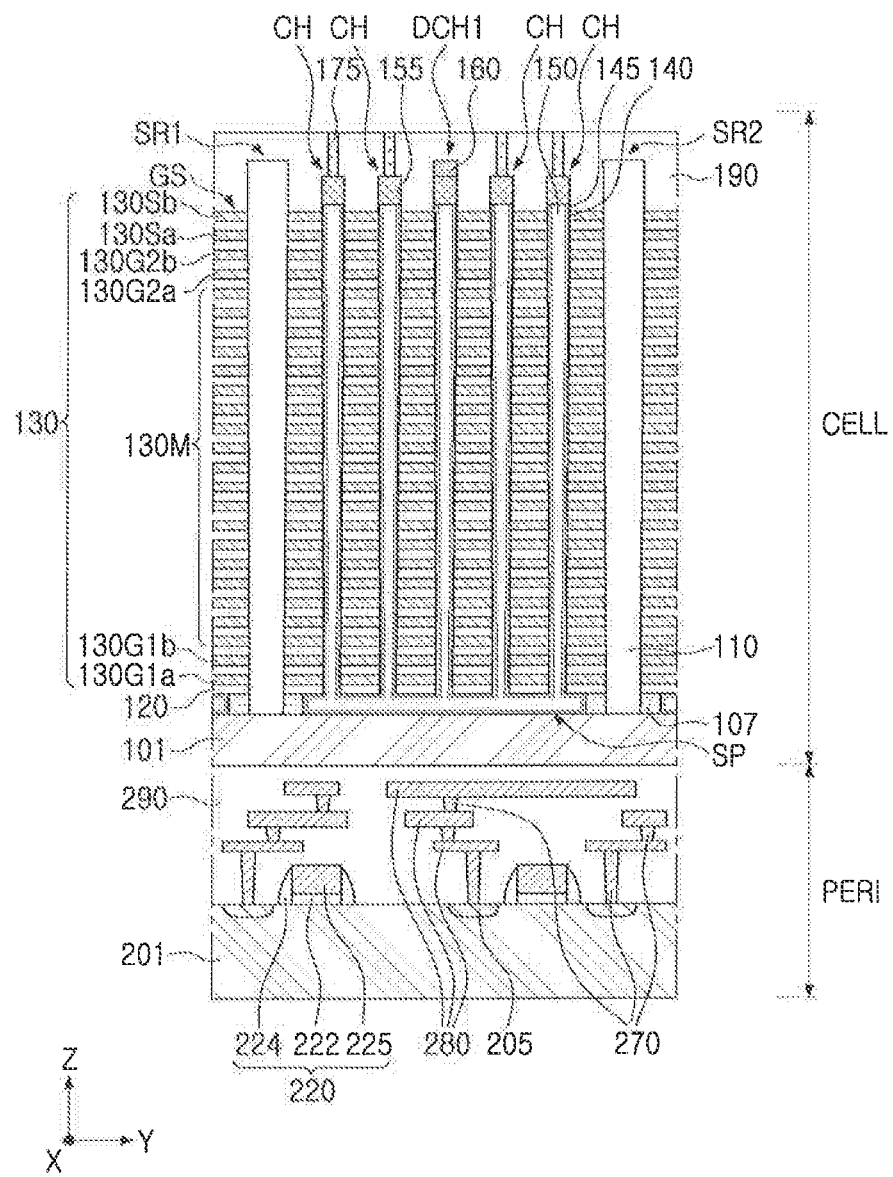

Referring to FIG. 14I, contact plugs 175 and a bit line 170 may be formed.

The contact plugs 175 may be formed by, after exposing the channel pads 155 of the channels CH by etching a cell region insulating layer 190, filling the etched portion with a conductive material.

Referring back to FIG. 4A, a bit line 170 may be formed on the contact plugs 175. The bit line 170 may extend in a y direction, and may allow the channel pads 155 of the channels CH disposed in a row in the y direction to be connected to different bit lines 170. To this end, an additional wiring line and contact plugs may further be included.

Figure 15:
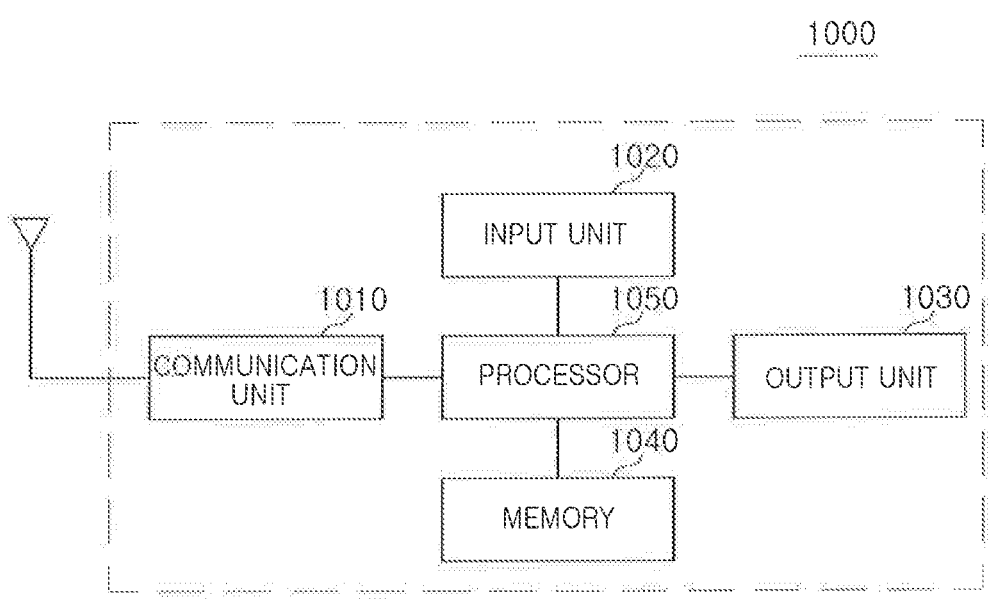
FIG. 15 is a block diagram illustrating an electronic device including a semiconductor device according to an example embodiment of the present inventive concept.

FIG. 15 is a block diagram illustrating an electronic device including a semiconductor device according to an example embodiment.

Referring to FIG. 15, an electronic device 1000 may include a communication unit 1010 (also referred to as a communication circuit), an input unit 1020 (also referred to as an input circuit), an output unit 1030 (also referred to as an output circuit), a memory 1040, and a processor 1050.

The communication unit 1010 may include a wired/wireless communication module, and may include a wireless Internet module, a near field communication module, a GPS module, a mobile communication module, etc. The wired/wireless communication module included in the communication unit 1010 may be connected to an external communication network based on various communication standards and may transmit and receive data. The input unit 1020 may be a module provided for a user to control operations of the electronic device 1000. The input unit 1020 may include, for example, a mechanical switch, a touchscreen, a voice recognition module, etc., and may further include a variety of sensor modules to which a user may input data. The output unit 1030 may output information processed in the electronic device 1000 in a form of, for example, voice or image.

The memory 1040 may, for example, store a program for processing or controlling the processor 1050 or may store data. The memory 1040 may include one or more semiconductor devices described in the aforementioned example embodiments (e.g., described with reference to FIGS. 3 and 13), and may be embedded in the electronic device 1000 or may communicate with the processor 1050 through an interface. The processor 1050 may control operations of the units included in the electronic device 1000. The processor 1050 may perform a control operation or a processing operation related to, for example, a voice call, a video call, data communication, etc., or may perform a control operation and a processing operation for reproduction and management of multimedia information. The processor 1050 may also process an input transferred from a user via the input unit 1020 and may output the result via the output unit 1030, and may store data used for controlling an operation of the electronic device 1000 in the memory 1040 or may retrieve data from the memory 1040.

According to the aforementioned example embodiments, by including ground select transistors in an upper portion and a lower portion of memory cell transistors in a semiconductor device including a source contact plug using the same type of channels as channels of a memory cell string, a semiconductor device having increased integration density and improved reliability may be provided.

As is traditional in the field of the inventive concept, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

Also, each block, unit and/or module of the example embodiments may be physically separated into two or more interacting and discrete blocks, units and/or modules without departing from the scope of the inventive concept. Further, the blocks, units and/or modules of the example embodiments may be physically combined into more complex blocks, units and/or modules without departing from the scope of the inventive concept.

In example embodiments of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In example embodiments of the present inventive concept, the 3D memory array includes vertical NAND strings that are vertically oriented such that at least one memory cell is located over another memory cell. The at least one memory cell may comprise a charge trap layer. The following patent documents, which are hereby incorporated by reference, describe suitable configurations for three-dimensional memory arrays, in which the three-dimensional memory array is configured as a plurality of levels, with word lines and/or bit lines.

While the present inventive concept has been particularly shown and described with reference to the example embodiments thereof, it will be understood by those of ordinary skill in the art that various changes in form and detail may be made therein without departing from the spirit and scope of the present inventive concept as defined by the following claims.

What is claimed is:

1. A semiconductor device, comprising:
a plurality of gate electrodes spaced apart from each other and stacked in a first direction perpendicular to an upper surface of a substrate, and extending by different lengths in a second direction perpendicular to the first direction;
first and second channels penetrating through the gate electrodes and extending in the first direction;
a horizontal portion disposed in lower portions of the gate electrodes and connecting lower portions of the first and second channels to each other; and
a source line disposed in an upper portion of the second channel and connected to the second channel,
wherein the gate electrodes comprise memory cell electrodes included in memory cells, a first ground select electrode disposed in lower portions of the memory cell electrodes, a second ground select electrode disposed in upper portions of the memory cell electrodes, and a string select electrode disposed in the upper portions of the memory cell electrodes.

2. The semiconductor device of claim 1, further comprising:
a plurality of peripheral circuits spaced apart from the gate electrodes,
wherein the first ground select electrode, the second ground select electrode, and the string select electrode are electrically connected to different peripheral circuits, respectively.

3. The semiconductor device of claim 1,
wherein the second ground select electrode is disposed between the memory cell electrodes and the string select electrode, and
wherein the semiconductor device further comprises an upper insulating region intersecting with the second channel, extending in the second direction, and dividing the string select electrode disposed in an uppermost portion among the gate electrodes.

4. The semiconductor device of claim 3, wherein the string select electrode is divided by the upper insulating region and the second channel.

5. The semiconductor device of claim 4, wherein the second ground select electrode completely surrounds side surfaces of the second channel.

6. The semiconductor device of claim 1, wherein a transistor including the second ground select electrode has a structure different from a structure of a transistor including the string select electrode.

7. The semiconductor device of claim 1, further comprising:
a bit line disposed in an upper portion of the first channel and connected to the first channel.

8. The semiconductor device of claim 1, wherein the gate electrodes further comprise a first dummy gate electrode disposed between the memory cell electrodes and the second ground select electrode.

9. The semiconductor device of claim 8, wherein the gate electrodes further comprise a second dummy gate electrode disposed between the second ground select electrode and the string select electrode.

10. The semiconductor device of claim 1, wherein the second ground select electrode is one of two second ground select electrodes, and the string select electrode is one of two string select electrodes.

11. The semiconductor device of claim 1,
wherein the substrate comprises a first region in which the gate electrodes are stacked and a second region in which the gate electrodes extend by different lengths, and
wherein the semiconductor device further comprises:
a plurality of first separation regions penetrating through the gate electrodes, extending in the second direction, and separating the gate electrodes;
a second separation region penetrating through the gate electrodes and extending in the second direction from the first region between two adjacent first separation regions; and
a third separation region spaced apart from the second separation region in the second direction in the second region.

12. The semiconductor device of claim 11, wherein the second and third separation regions each penetrate through a portion of the second ground select electrode.

13. The semiconductor device of claim 12, wherein the second ground select electrode is disposed as a single layer between two first separation regions.

14. The semiconductor device of claim 11, wherein the second separation region penetrates through the string select electrode and the second ground select electrode.

15. The semiconductor device of claim 14, wherein the second ground select electrode is divided into two layers between two first separation regions.

16. The semiconductor device of claim 1, further comprising:
a third channel penetrating through the gate electrodes and extending in the first direction, and connected to the first and second channels by the horizontal portion,
wherein the first to third channels comprise a plurality of channel pads disposed on upper ends and including impurities, and
wherein the channel pads disposed in the first and second channels comprise first conductivity-type impurities, and the channel pads disposed in the third channel comprises second conductivity-type impurities.

17. The semiconductor device of claim 16, wherein the third channel is aligned with the second channel in the second direction.

18. The semiconductor device of claim 16, wherein the third channel is connected to the source line.

19. The semiconductor device of claim 1,
wherein the first and second channels comprise a gate dielectric layer and a channel region sequentially stacked from the gate electrodes, and
wherein the gate dielectric layer and the channel region extend to the horizontal portion from the first and second channels, and the gate dielectric layer and the channel region are connected to each other.

20. The semiconductor device of claim 1,
wherein the second channel is one of a plurality of second channels disposed in the second direction, and
wherein the semiconductor device further comprises a channel connection portion disposed on side surfaces of at least portions of the plurality of second channels and connecting two adjacent second channels to each other.

21. A semiconductor device, comprising:
a bit line;
a source line;
a first cell string; and
a second cell string,
wherein each of the first and second cell strings comprises a plurality of memory cell transistors connected to each other in series, a first ground select transistor disposed on a first end of the memory cell transistors, a second ground select transistor disposed on a second end of the memory cell transistors, and a string select transistor,
wherein the first cell string is connected to the bit line, and the second cell string is separated from the bit line and is connected to the source line.

22. The semiconductor device of claim 21, wherein the second ground select transistor has a structure different from a structure of the string select transistor in the second cell string.

23. The semiconductor device of claim 21, wherein the string select transistor of the first cell string has a structure different from a structure of the string select transistor of the second cell string.

24. The semiconductor device of claim 21, wherein the first cell string is a memory cell string, and the second cell string is a dummy cell string which does not constitute a memory cell.

25. The semiconductor device of claim 21, further comprising:
first to fourth circuits respectively driving the first ground select transistor, the memory cell transistors, the second ground select transistor, and the string select transistor,
wherein the first to fourth circuits are separately controlled in program operations of the memory cell transistors.

26. The semiconductor device of claim 25,
wherein the first circuit applies a first operational voltage to a gate electrode of the first ground select transistor,
wherein the second circuit applies a program voltage to a selected memory cell electrode among gate electrodes of the memory cell transistors,
wherein the third circuit applies a second operational voltage greater than the first operational voltage to a gate electrode of the second ground select transistor, and
wherein the fourth circuit applies the second operational voltage to a gate electrode of the string select transistor.

27. The semiconductor device of claim 26, further comprising:
a third cell string connected to the bit line; and
a fifth circuit applying a third operational voltage less than the second operational voltage to a gate electrode of a string select transistor of the third cell string.

28. A semiconductor device, comprising:
a plurality of gate electrodes comprising memory cell electrodes spaced apart from each other and stacked in a direction perpendicular to an upper surface of a substrate, a first ground select electrode disposed between the substrate and the memory cell electrodes, a string select electrode disposed on the memory cell electrodes, and a second ground select electrode disposed on the memory cell electrodes,
wherein the memory cell electrodes are included in memory cells;
a plurality of channels penetrating through the gate electrodes and extending onto the substrate, and constituting the memory cells; and
a dummy channel penetrating through the gate electrodes and extending onto the substrate, and electrically connected to a source line.

29. The semiconductor device of claim 28, wherein the second ground select electrode is disposed between the string select electrode and the memory cell electrodes.

30. The semiconductor device of claim 28, wherein a transistor constituted by the second ground select electrode and the dummy channel has a structure different from a structure of a transistor constituted by the string select electrode and the dummy channel.

31. The semiconductor device of claim 30, wherein the second ground select electrode completely surrounds side surfaces of the dummy channel, and the string select electrode is divided.

\* \* \* \* \*